(12) United States Patent
Kobori

(10) Patent No.: US 10,707,446 B2
(45) Date of Patent: *Jul. 7, 2020

(54) DISPLAY UNIT AND ELECTRONIC APPARATUS

(71) Applicant: SONY CORPORATION, Tokyo (JP)

(72) Inventor: Isamu Kobori, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/371,832

(22) Filed: Apr. 1, 2019

(65) Prior Publication Data

US 2019/0229294 A1 Jul. 25, 2019

Related U.S. Application Data

(63) Continuation of application No. 15/502,258, filed as application No. PCT/JP2015/071593 on Jul. 30, 2015, now Pat. No. 10,290,831.

(30) Foreign Application Priority Data

Aug. 19, 2014 (JP) ................................. 2014-166662

(51) Int. Cl.
*H01L 51/52* (2006.01)
*H01L 27/32* (2006.01)
*H05B 33/24* (2006.01)

(52) U.S. Cl.
CPC ...... *H01L 51/5271* (2013.01); *H01L 27/3246* (2013.01); *H01L 51/5228* (2013.01); *H01L 51/5275* (2013.01); *H01L 2227/323* (2013.01); *H05B 33/24* (2013.01)

(58) Field of Classification Search
CPC ............. H01L 51/5271; H01L 51/5228; H01L 51/5275; H01L 27/3246; H01L 2227/323; H05B 33/24
USPC ........................................................... 257/40
See application file for complete search history.

(56) References Cited

U.S. PATENT DOCUMENTS

| | | | |
|---|---|---|---|
| 5,834,893 A | 11/1998 | Bulovic et al. | |
| 6,091,195 A | 7/2000 | Forrest et al. | |
| 6,650,045 B1 * | 11/2003 | Forrest ................ | H01L 51/5271 313/503 |

(Continued)

FOREIGN PATENT DOCUMENTS

| | | |
|---|---|---|
| CN | 1964064 A | 5/2007 |
| CN | 103794739 A | 5/2014 |

(Continued)

OTHER PUBLICATIONS

Notice of Allowance and Fees Due for U.S. Appl. No. 15/502,258, dated Jan. 7, 2019, 08 pages.

(Continued)

*Primary Examiner* — Dzung Tran
(74) *Attorney, Agent, or Firm* — Chip Law Group

(57) ABSTRACT

A display unit includes: a light-emitting section including a light-emitting element that has a first electrode, an organic layer including a light-emitting layer, and a second electrode in this order; and a reflector that is provided at a periphery of the light-emitting section to reflect light from the light-emitting section, and has a conductive layer, the conductive layer being electrically coupled to the second electrode of the light-emitting element.

20 Claims, 21 Drawing Sheets

(56) References Cited

U.S. PATENT DOCUMENTS

| | | | |
|---|---|---|---|
| 7,482,182 B2* | 1/2009 | Yamazaki | H01L 33/0041 438/22 |
| 2004/0113550 A1 | 6/2004 | Adachi et al. | |
| 2004/0160165 A1* | 8/2004 | Yamauchi | H01L 27/3246 313/498 |
| 2005/0116620 A1* | 6/2005 | Kobayashi | H01L 51/5271 313/503 |
| 2005/0285107 A1 | 12/2005 | Koo et al. | |
| 2006/0138950 A1 | 6/2006 | Adachi et al. | |
| 2007/0103062 A1 | 5/2007 | Jung et al. | |
| 2007/0164667 A1* | 7/2007 | Ha | H01L 27/3244 313/504 |
| 2007/0278942 A1 | 12/2007 | Jung et al. | |
| 2008/0030132 A1 | 2/2008 | Adachi et al. | |
| 2010/0096988 A1 | 4/2010 | Kitabayashi et al. | |
| 2010/0135040 A1 | 6/2010 | Adachi et al. | |
| 2011/0037059 A1 | 2/2011 | Gyoda | |
| 2011/0285269 A1 | 11/2011 | Adachi et al. | |
| 2013/0169145 A1 | 7/2013 | Adachi et al. | |
| 2013/0307406 A1 | 11/2013 | Hosokawa | |
| 2014/0091705 A1 | 4/2014 | Adachi et al. | |
| 2014/0117334 A1 | 5/2014 | Nakamura et al. | |
| 2014/0319500 A1 | 10/2014 | Adachi et al. | |

FOREIGN PATENT DOCUMENTS

| | | |
|---|---|---|
| JP | 2004-192977 A | 7/2004 |
| JP | 2007-134327 A | 5/2007 |
| JP | 2009-206041 A | 9/2009 |
| JP | 2011-023240 A | 2/2011 |
| JP | 2014-089803 A | 5/2014 |
| KR | 10-2004-0051483 A | 6/2004 |
| KR | 10-2007-0048957 A | 5/2007 |
| TW | 201417273 A | 5/2014 |
| WO | 2012/102269 A1 | 8/2012 |

OTHER PUBLICATIONS

Non-Final Rejection for U.S. Appl. No. 15/502,258, dated Jul. 23, 2018, 17 pages.

Advisory Action for U.S. Appl. No. 15/502,258, dated Jun. 12, 2018, 03 pages.

Final Rejection for U.S. Appl. No. 15/502,258, dated Mar. 27, 2018, 18 pages.

Non-Final Rejection for U.S. Appl. No. 15/502,258, dated Oct. 10, 2017, 15 pages.

International Search Report and Written Opinion of PCT Application No. PCT/JP2015/071593, dated Oct. 20, 2015, 07 pages of English Translation and 07 pges of ISRWO.

International Preliminary Report on Patentability of PCT Application No. PCT/JP2015/071593, dated Mar. 2, 2017, 07 pages of English Translation and 05 pages of IPRP.

* cited by examiner

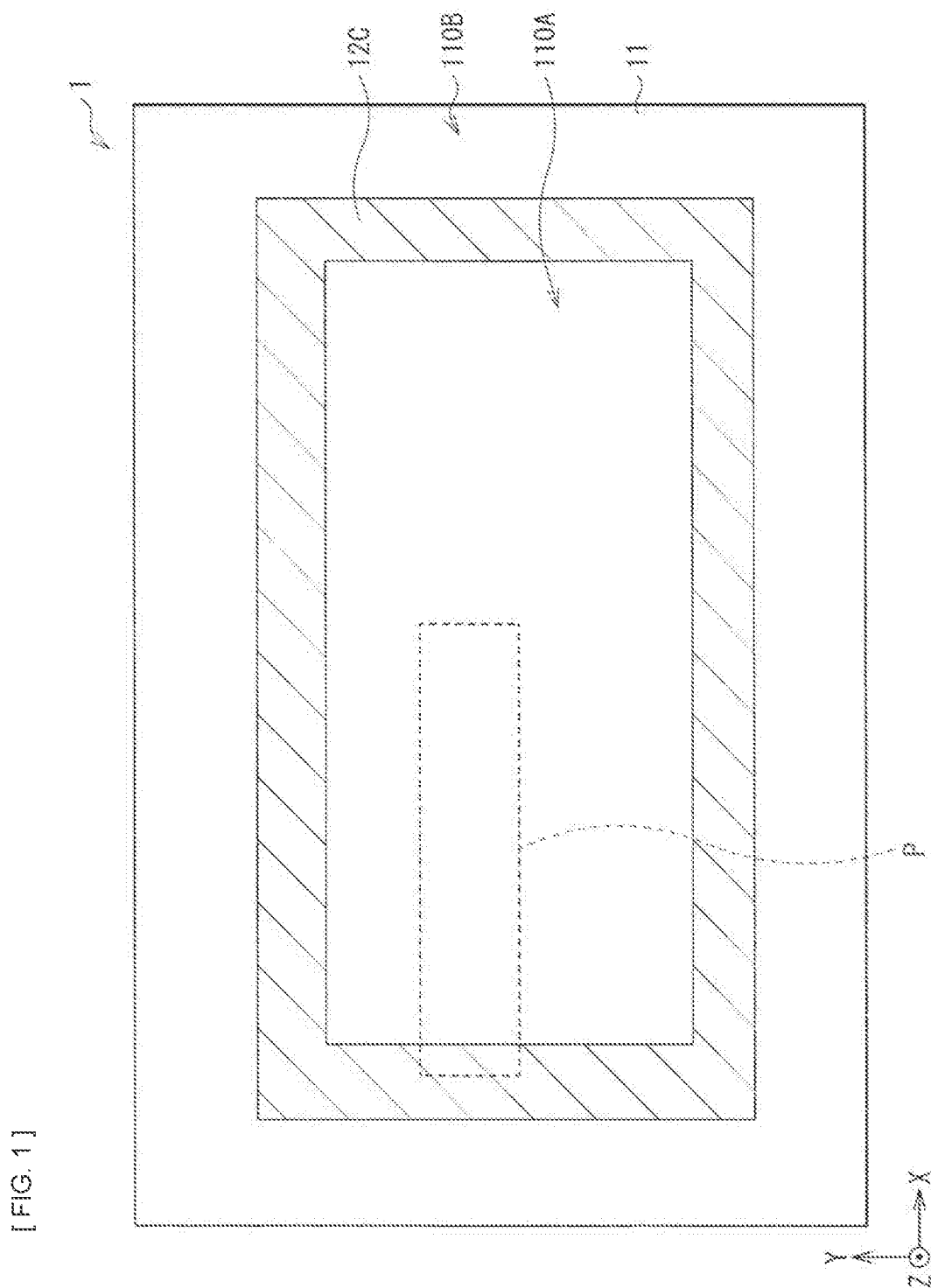

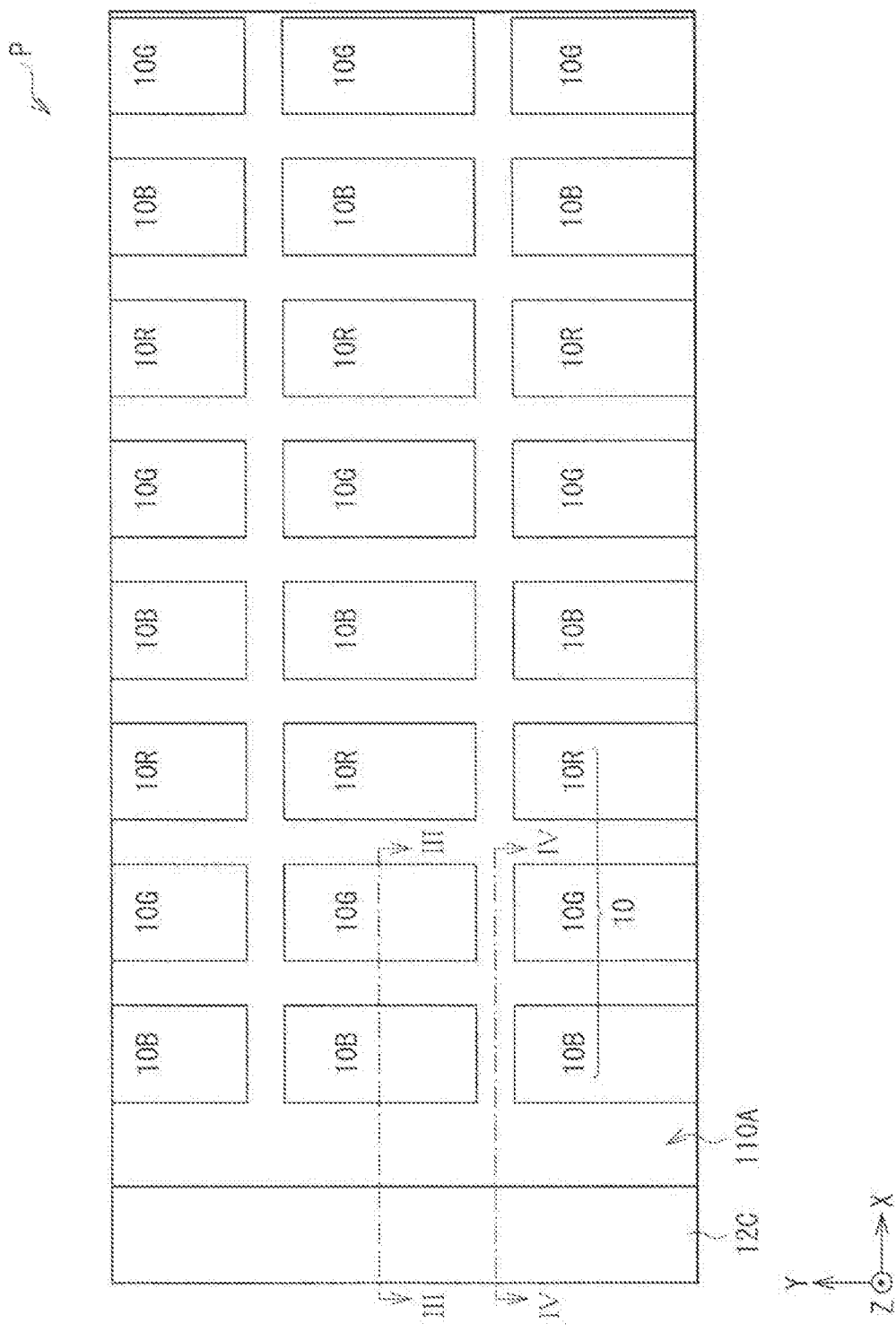

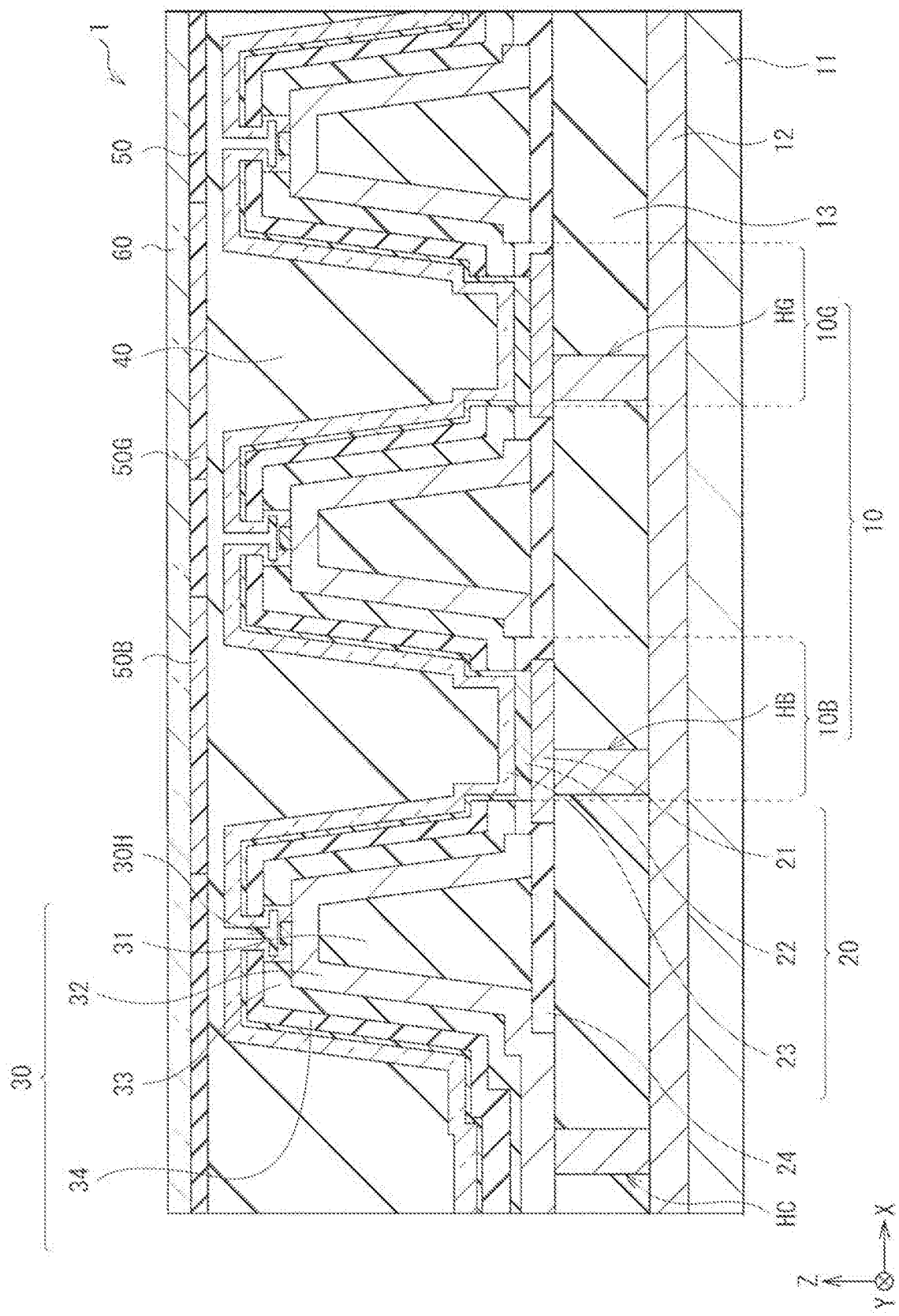
[FIG. 3]

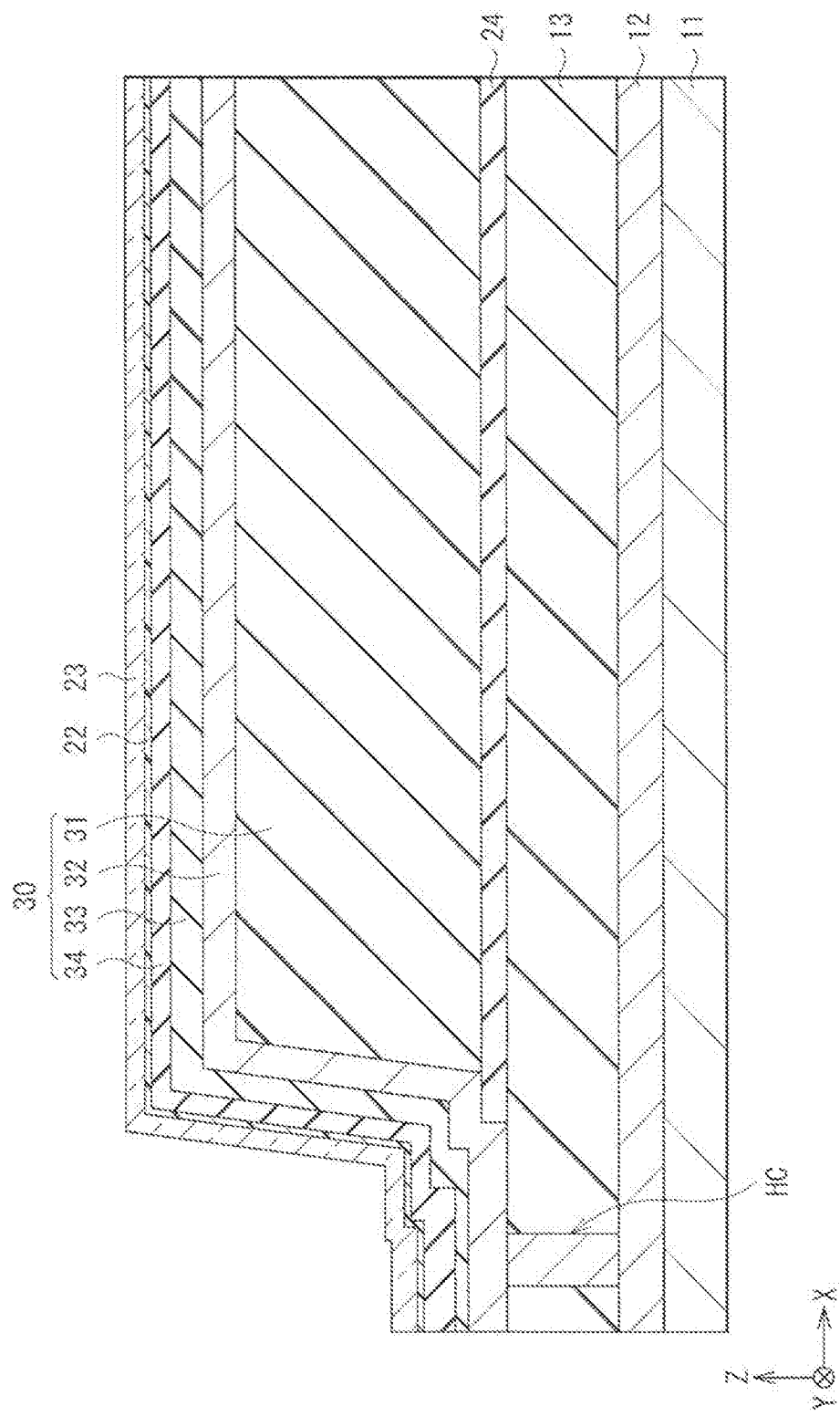
[FIG. 4]

[FIG. 5]
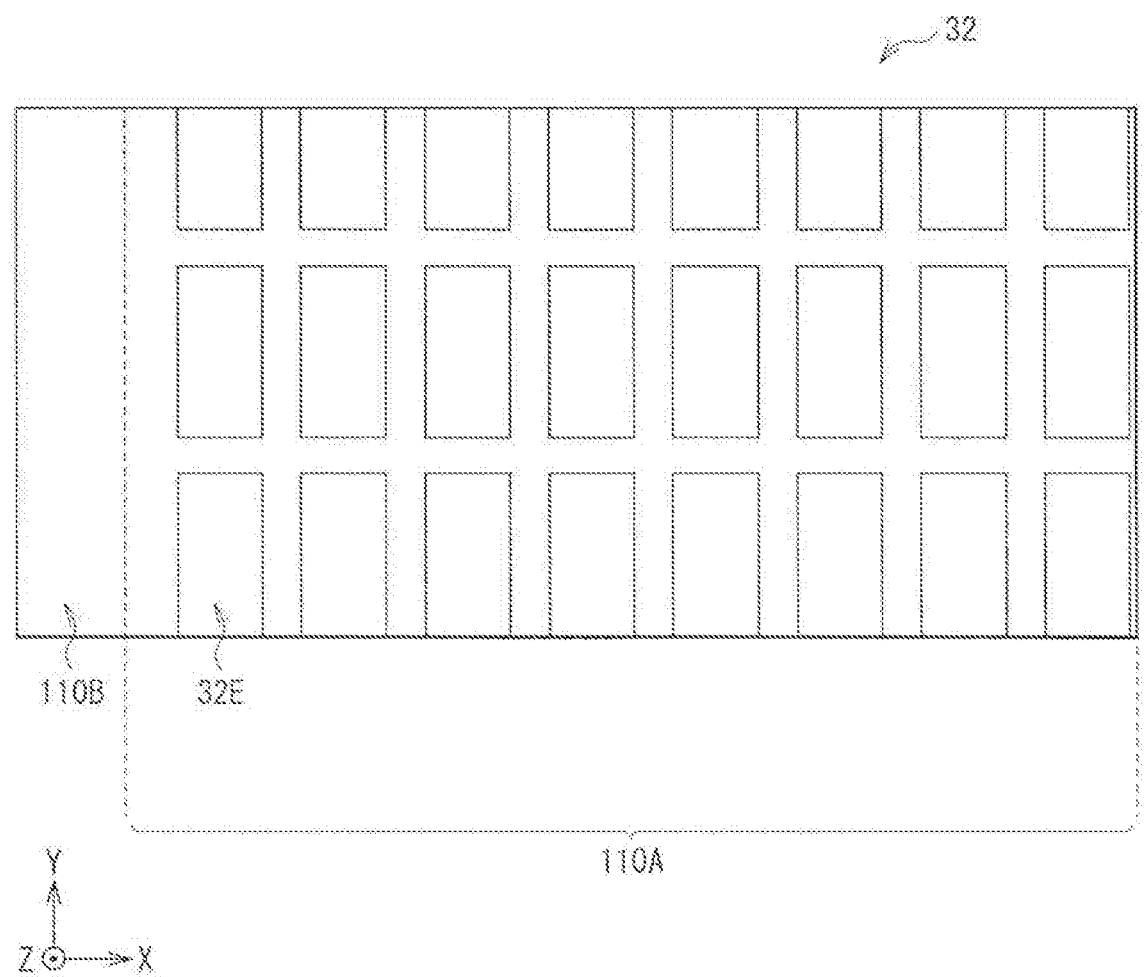

[FIG. 6]
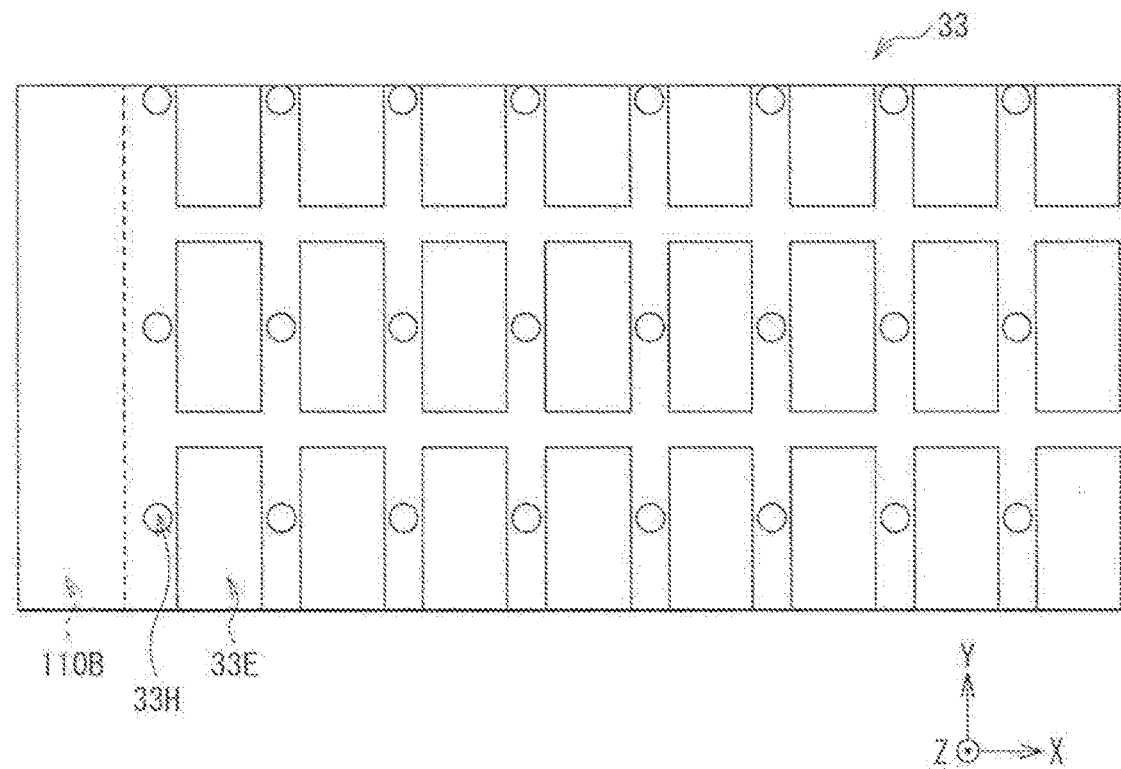
[FIG. 7]
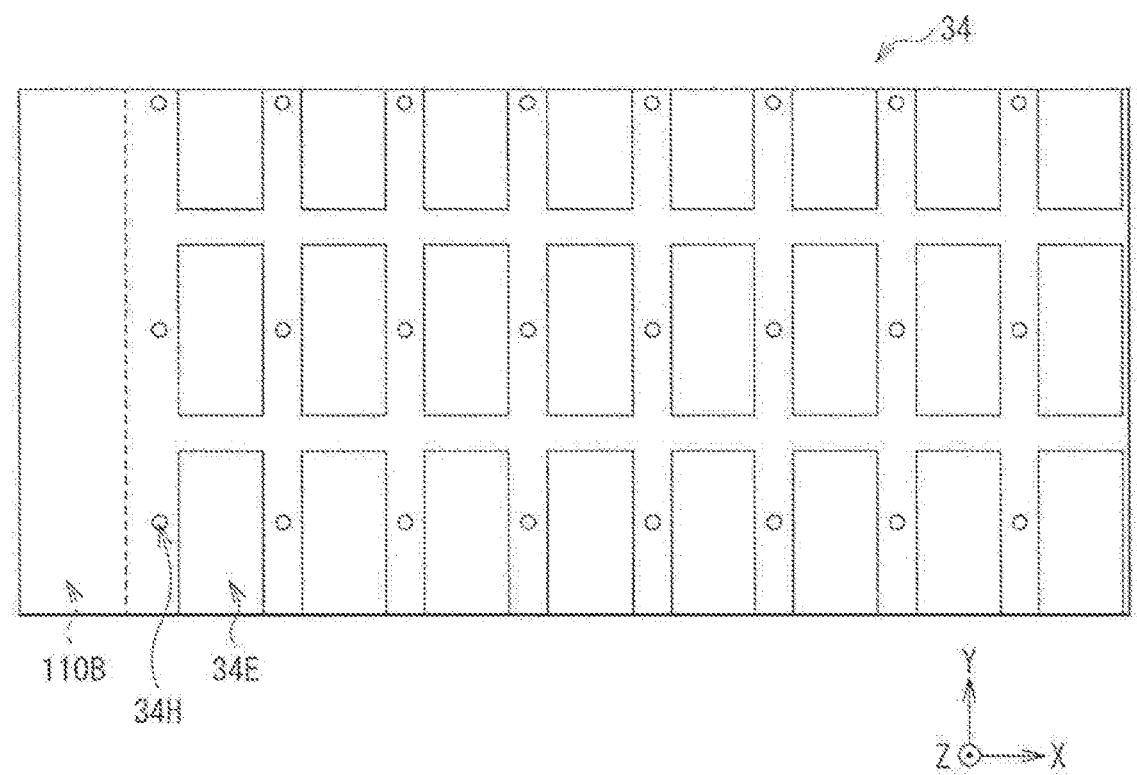

[FIG. 8]
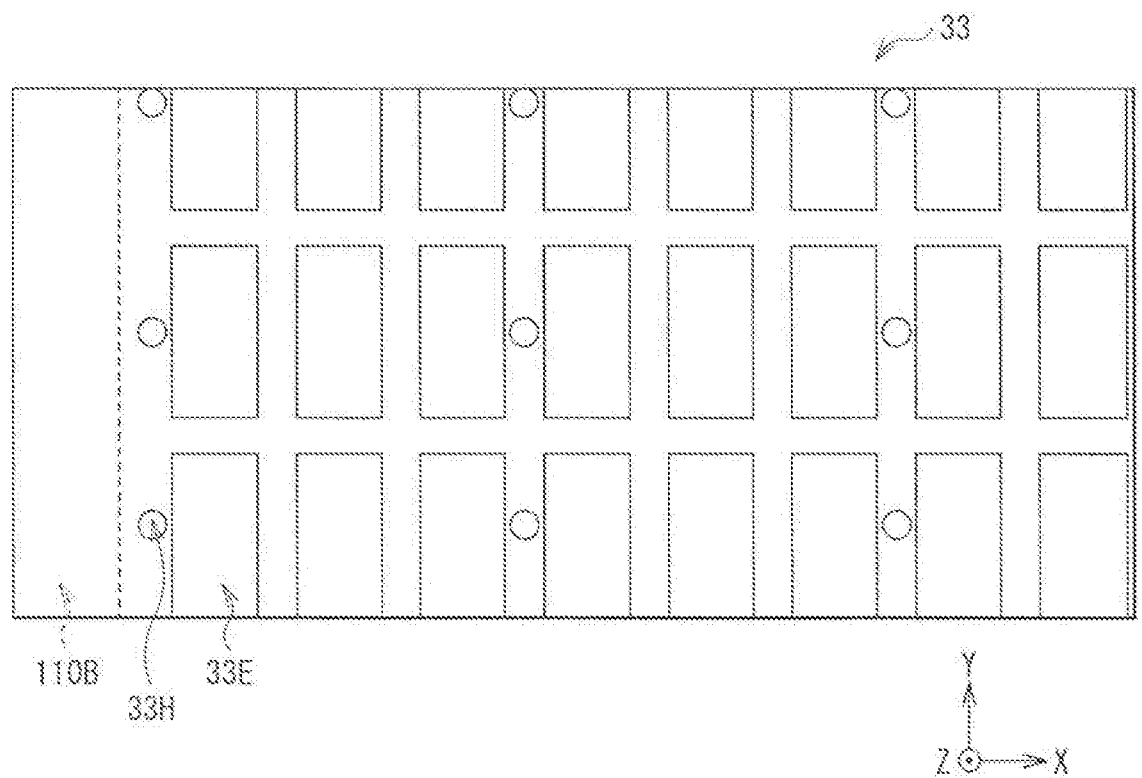
[FIG. 9]
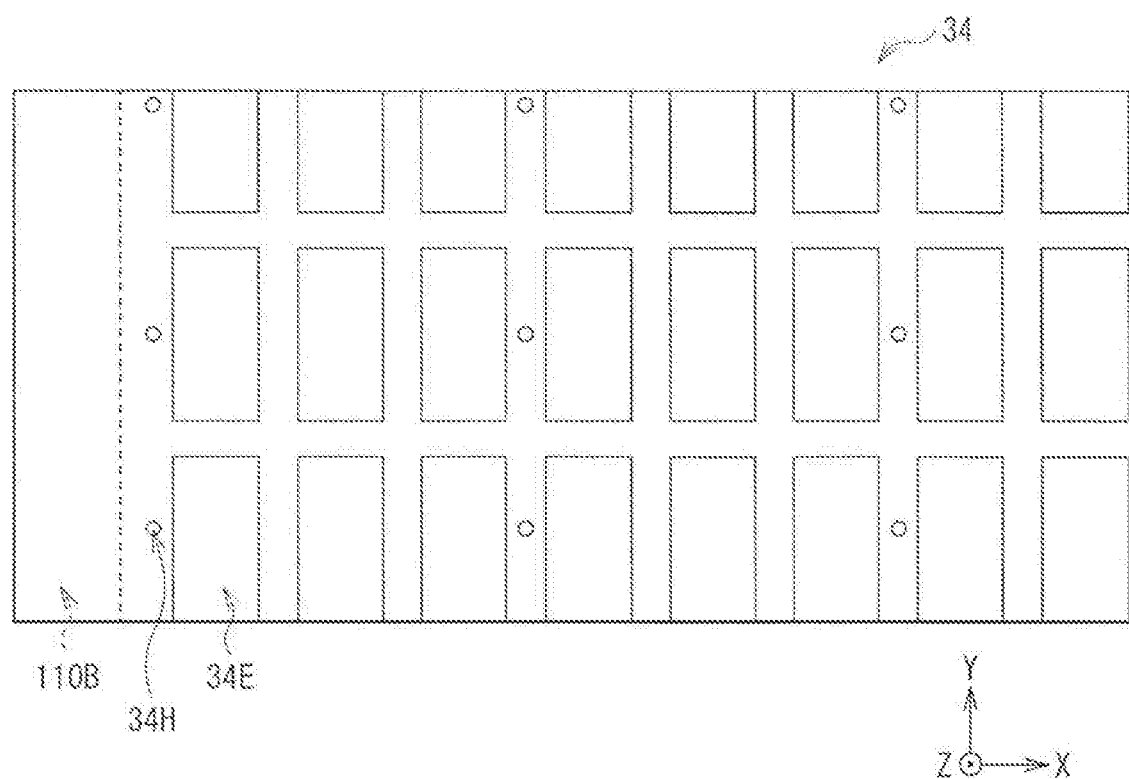

[ FIG. 10 ]
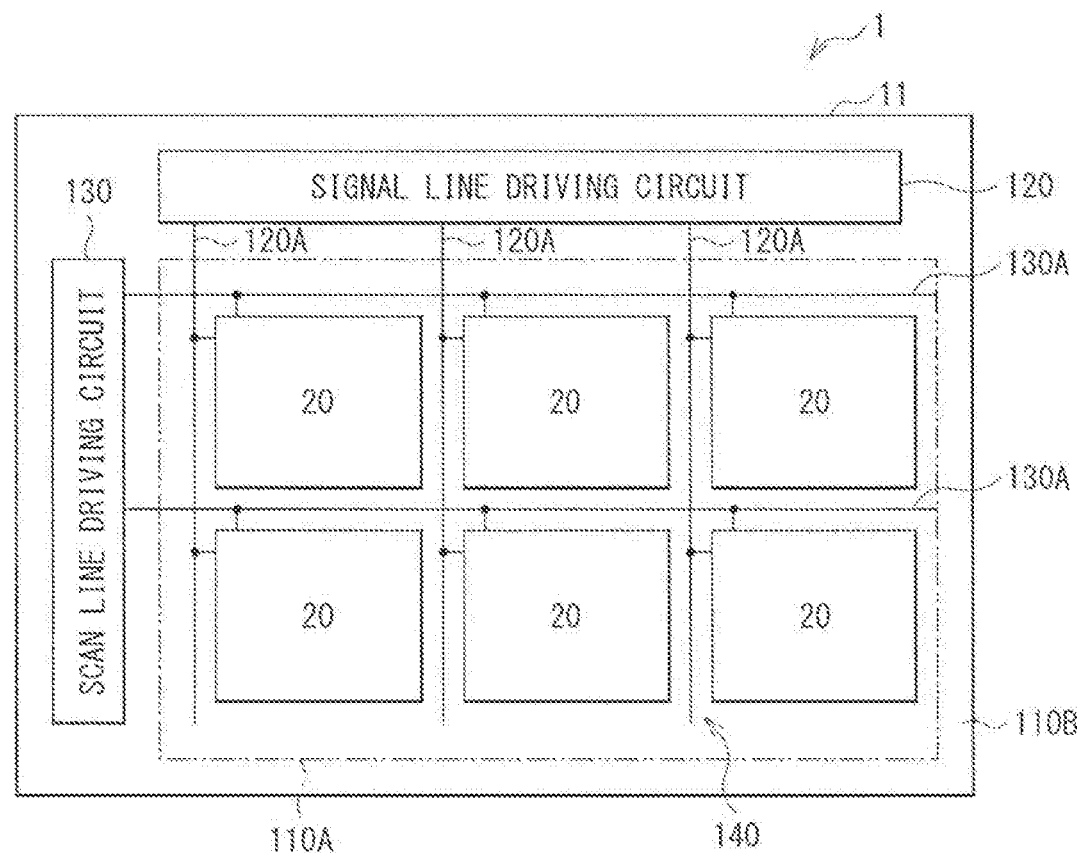
[ FIG. 11 ]
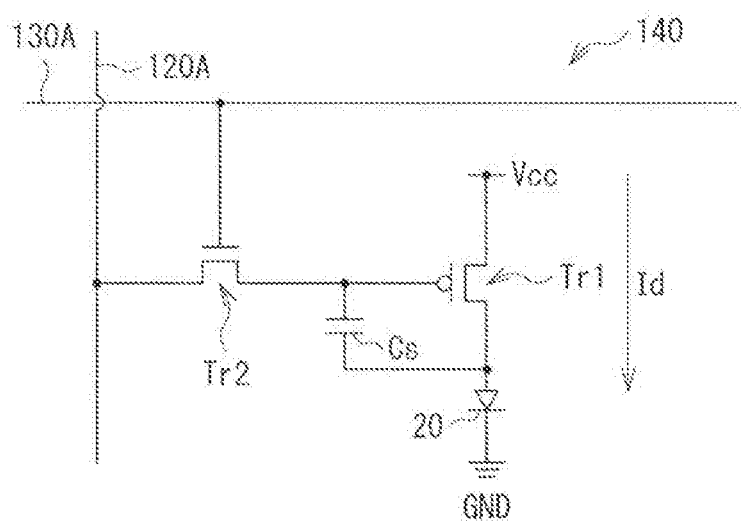

[FIG. 12]
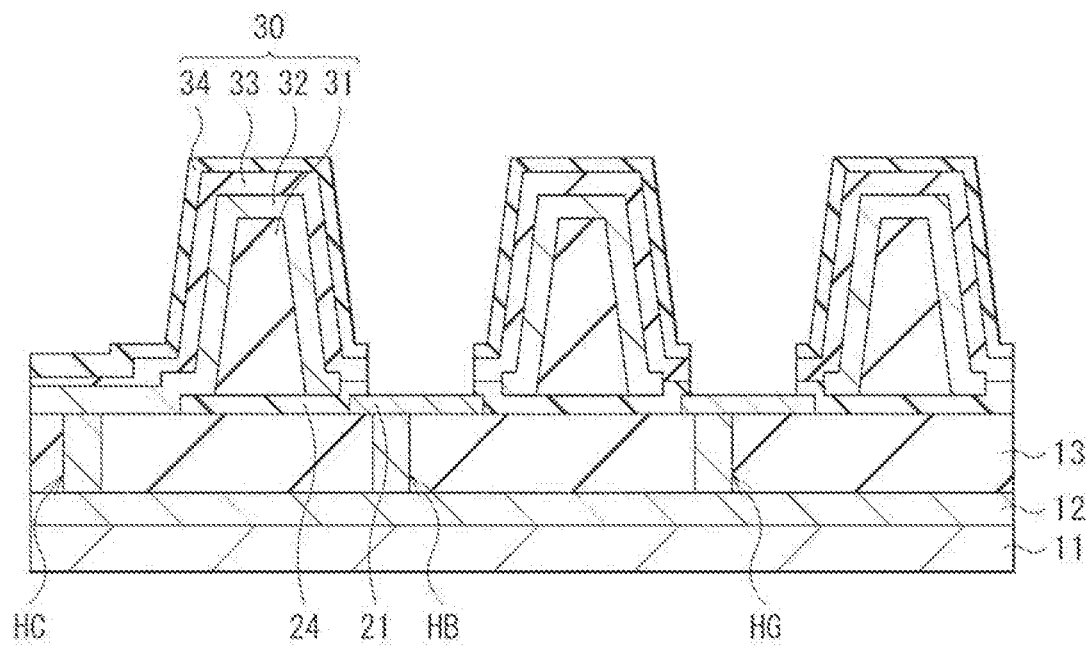
[FIG. 13]
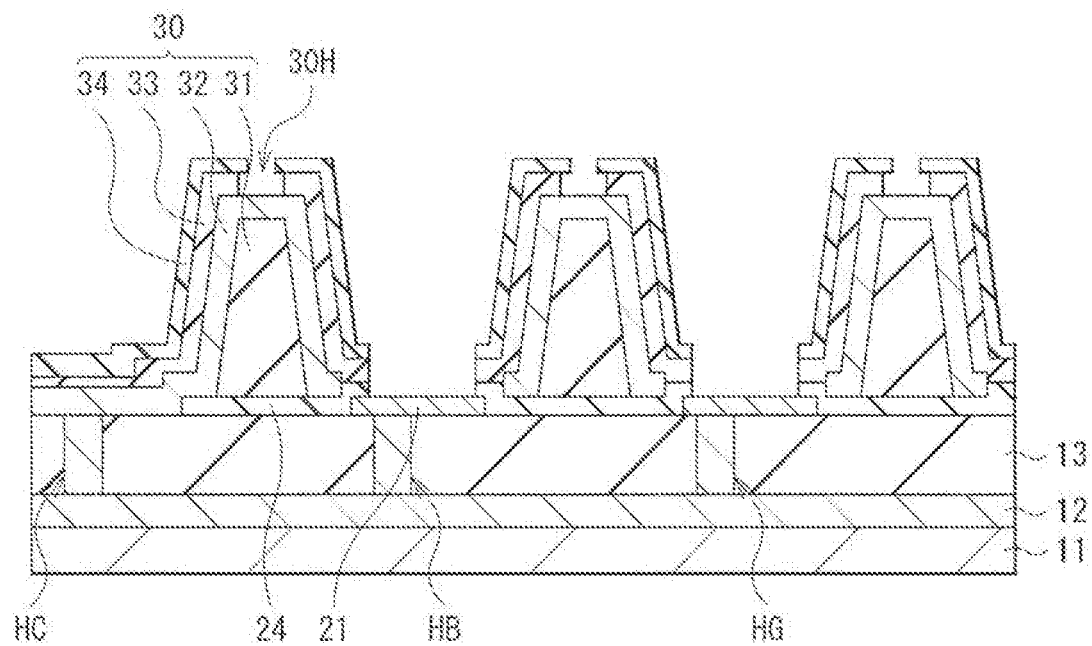

[FIG. 14]
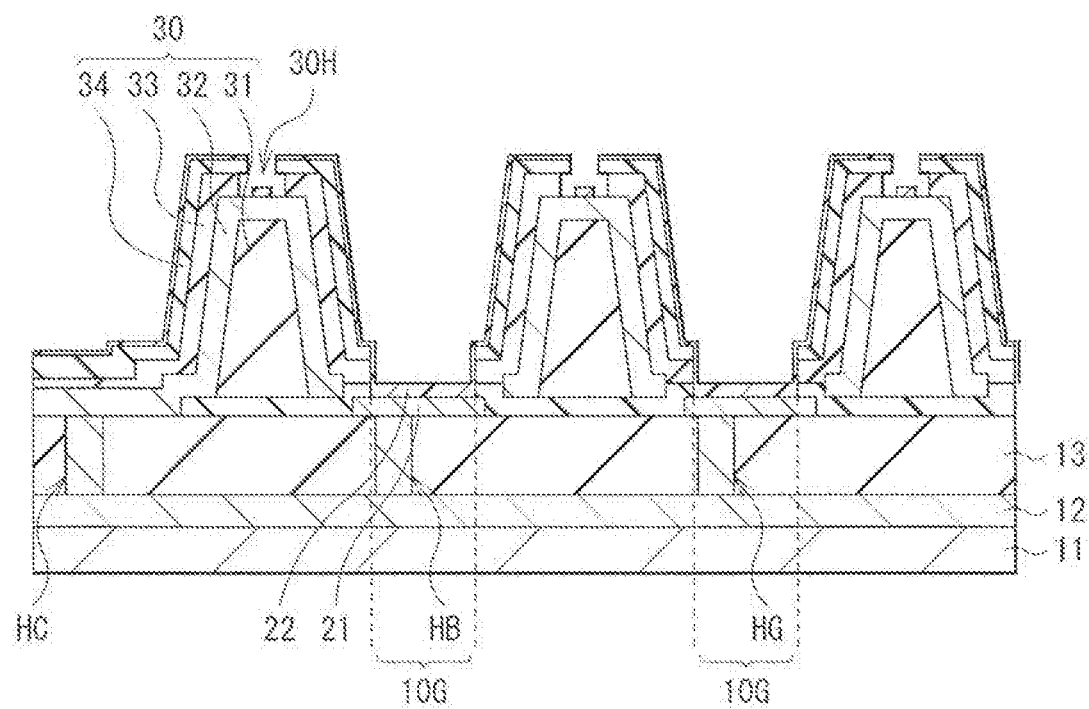
[FIG. 15]
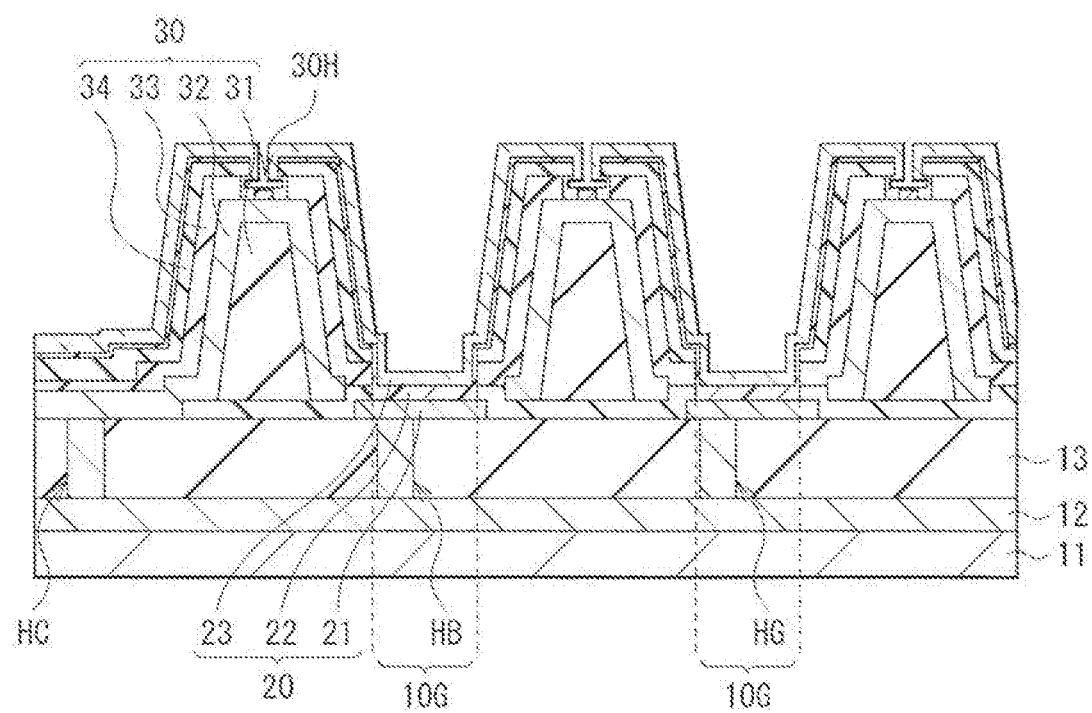

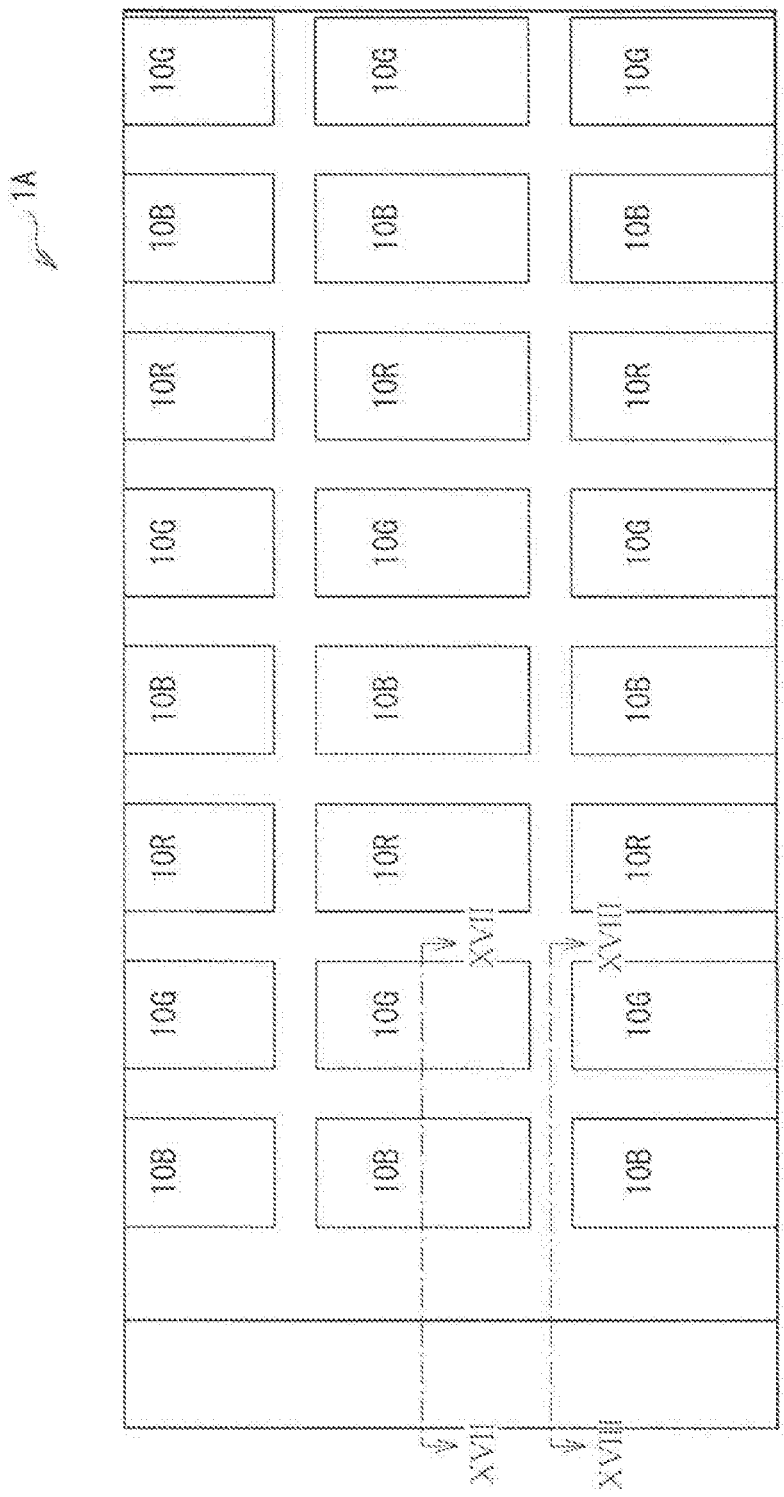
[FIG. 16]

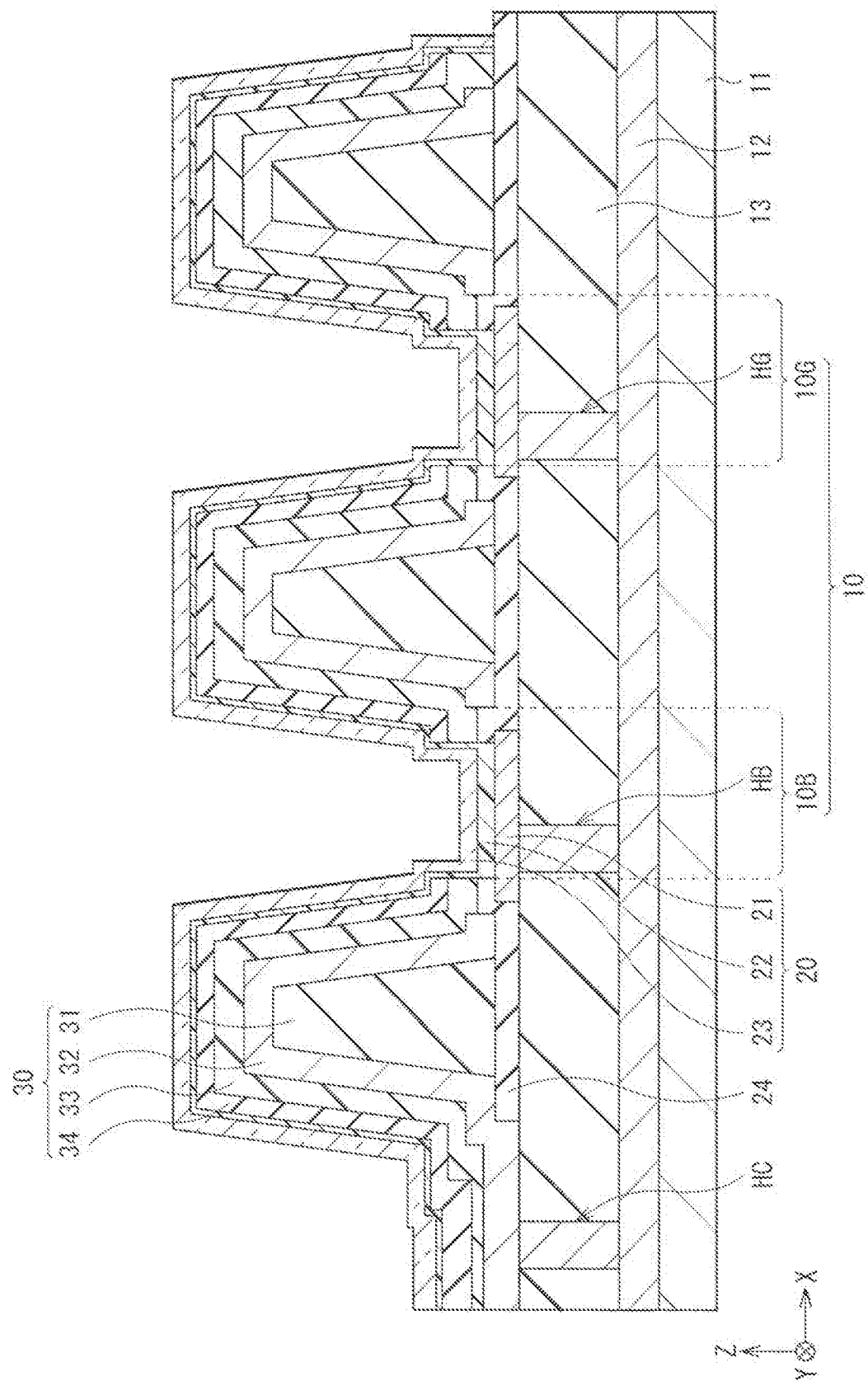

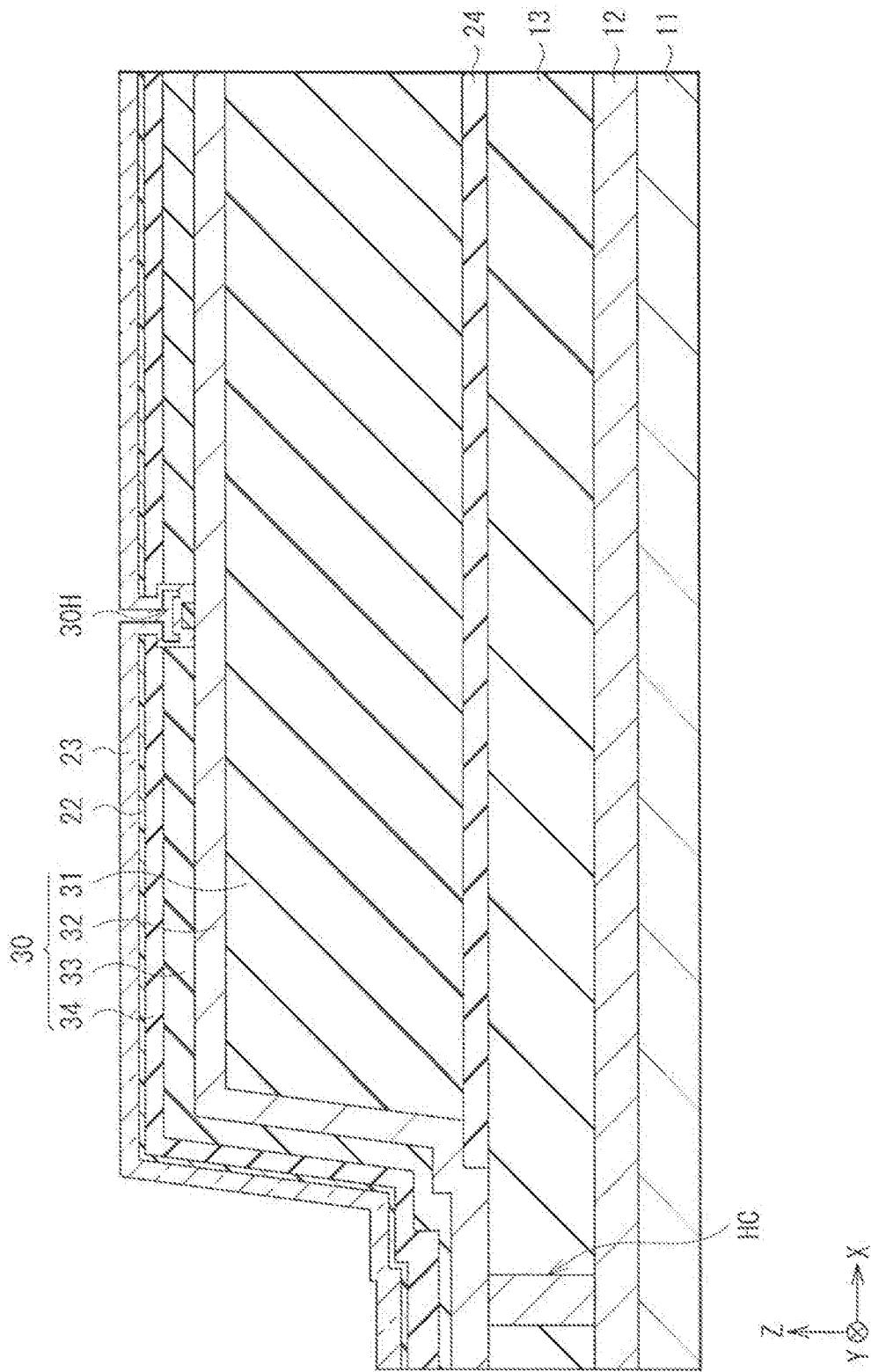
[FIG. 18]

[FIG. 19]
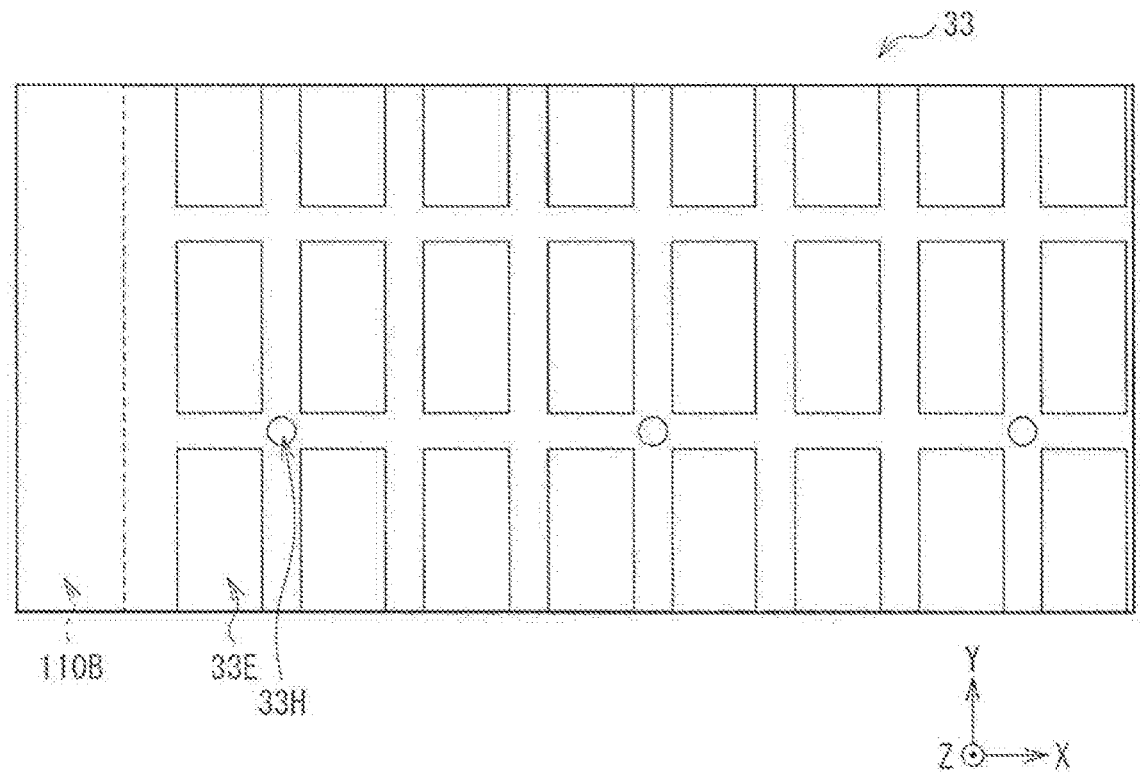
[FIG. 20]
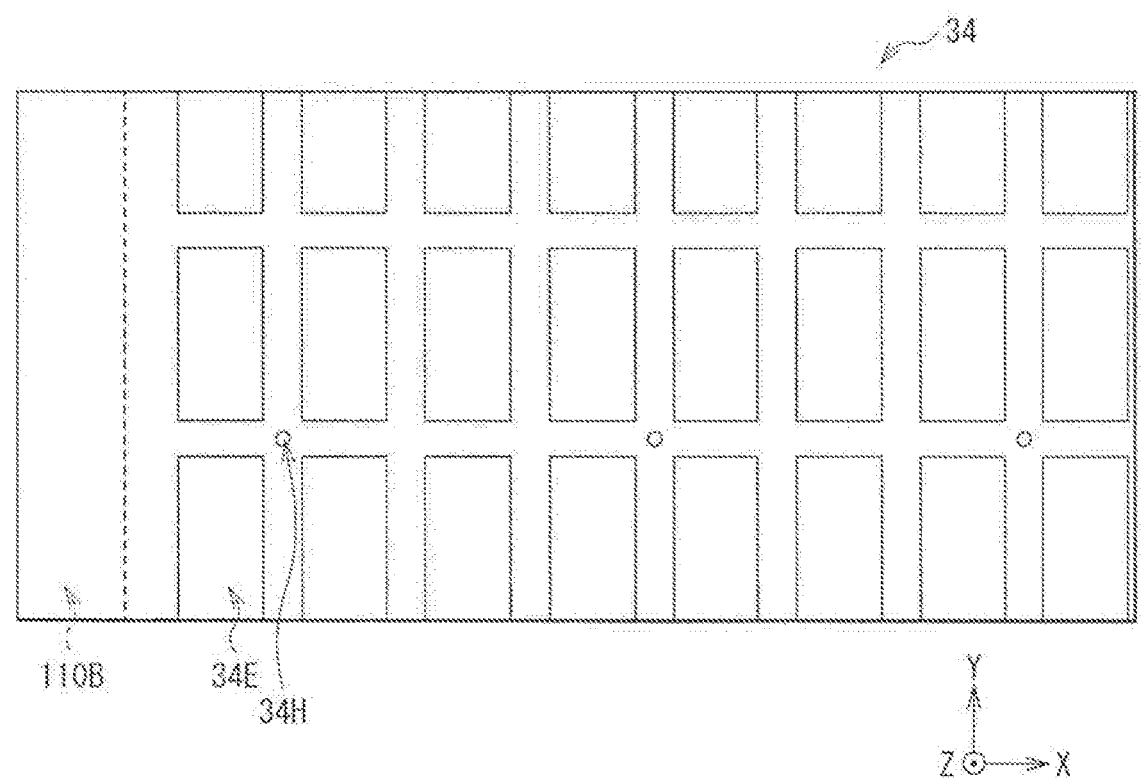

[FIG. 21]
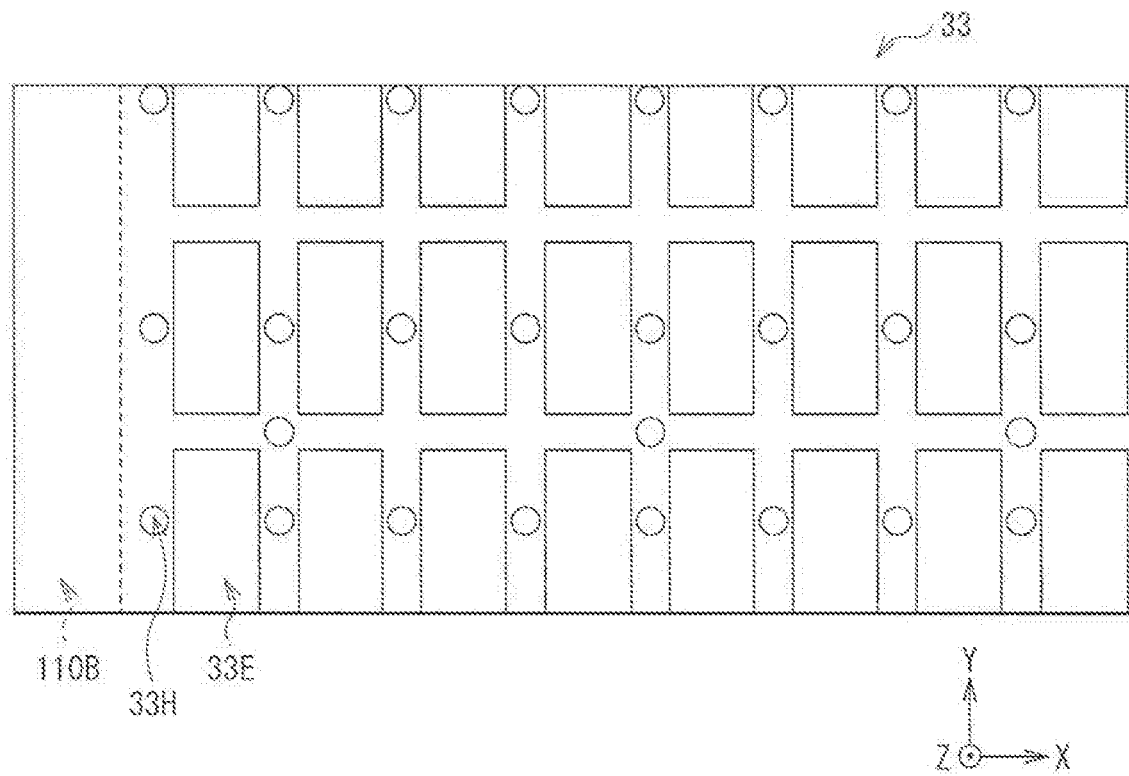
[FIG. 22]
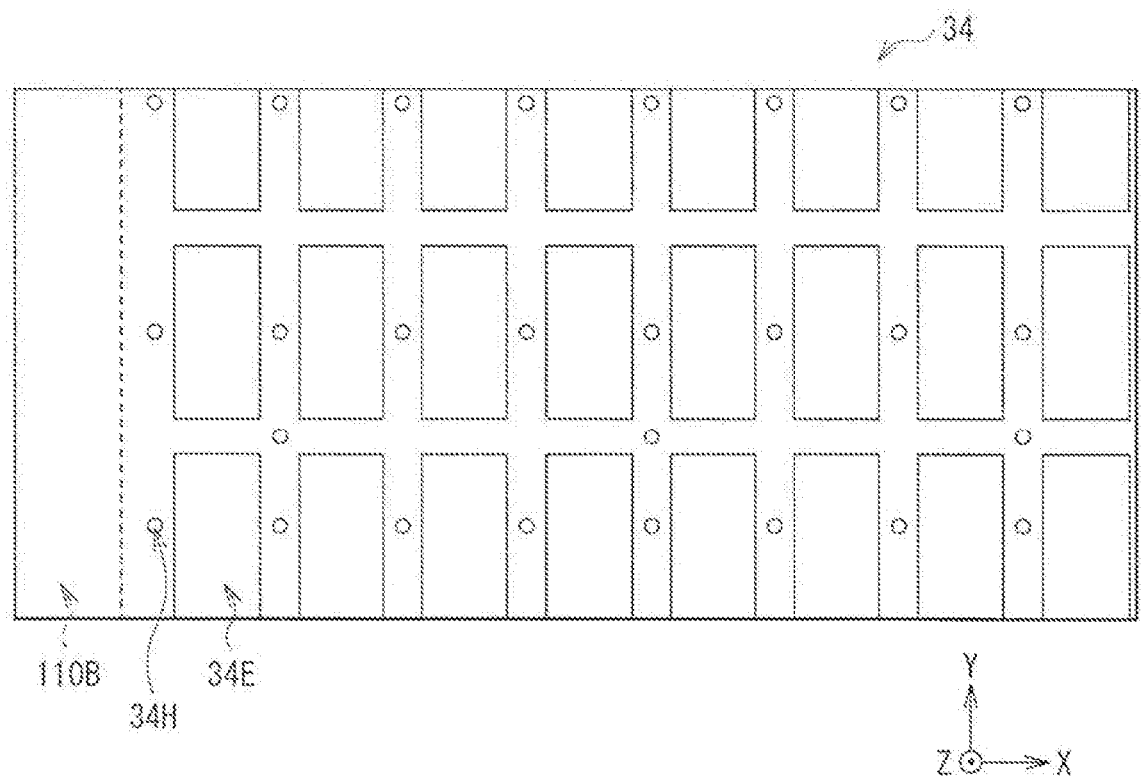

[ FIG. 23 ]
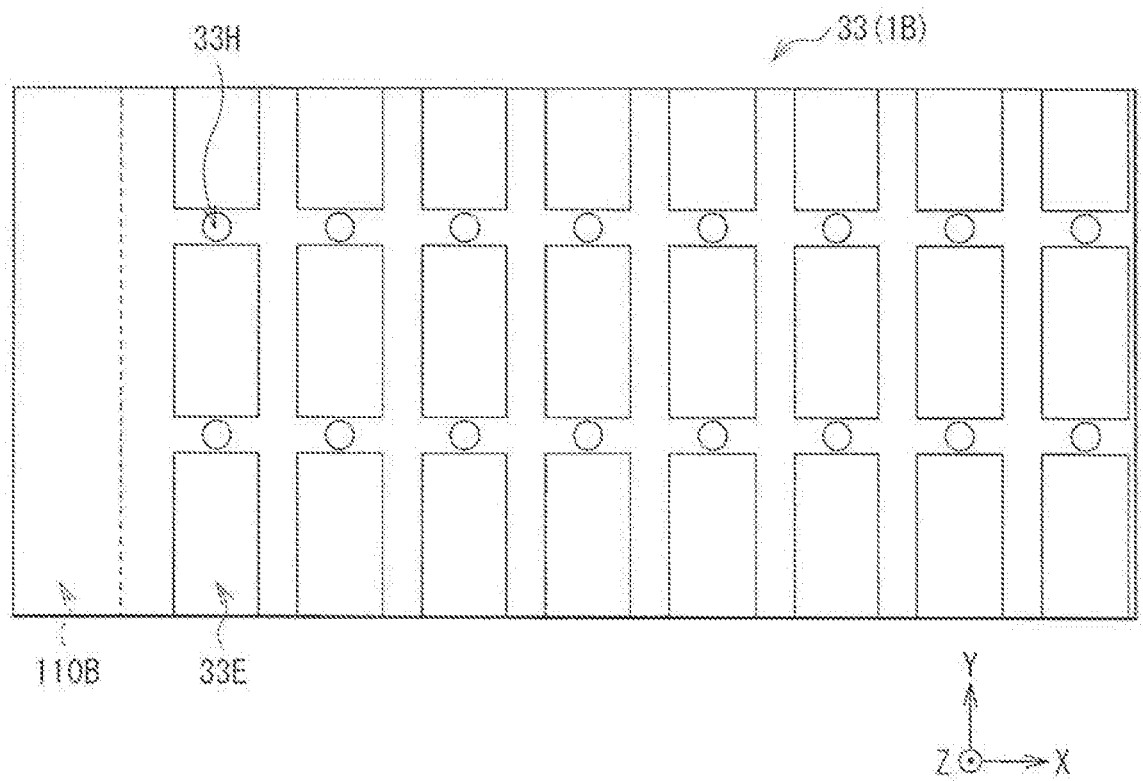
[ FIG. 24 ]
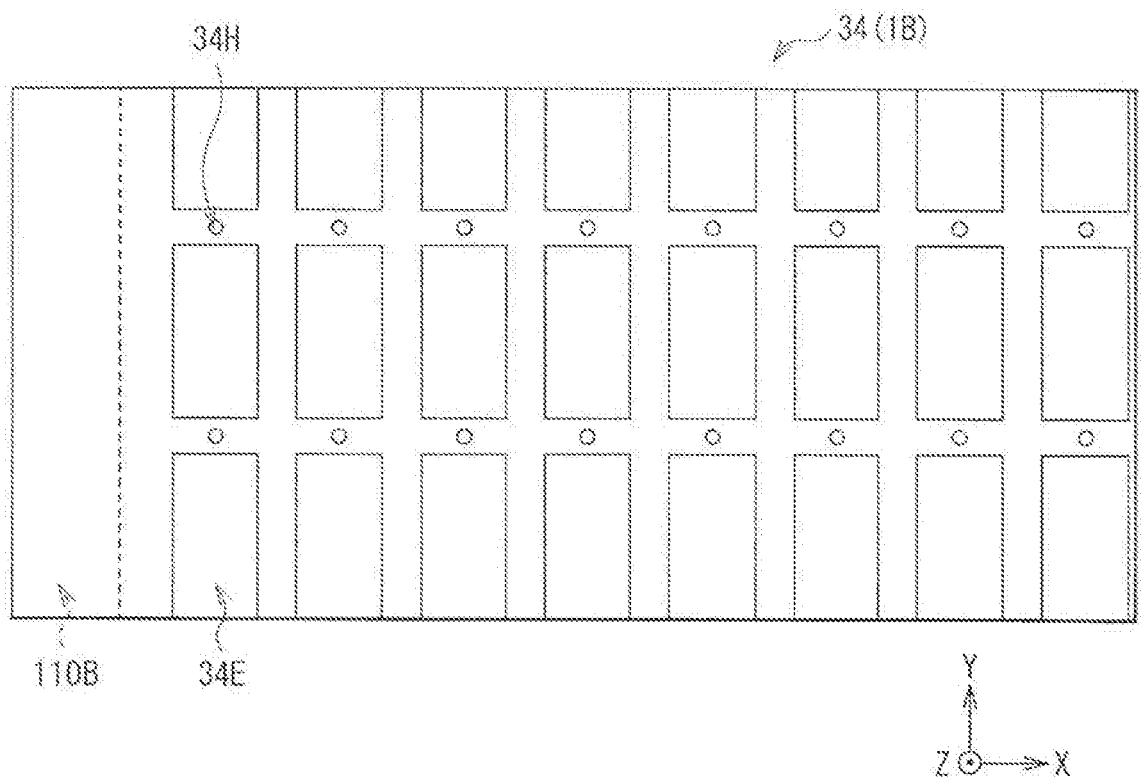

[FIG. 25]
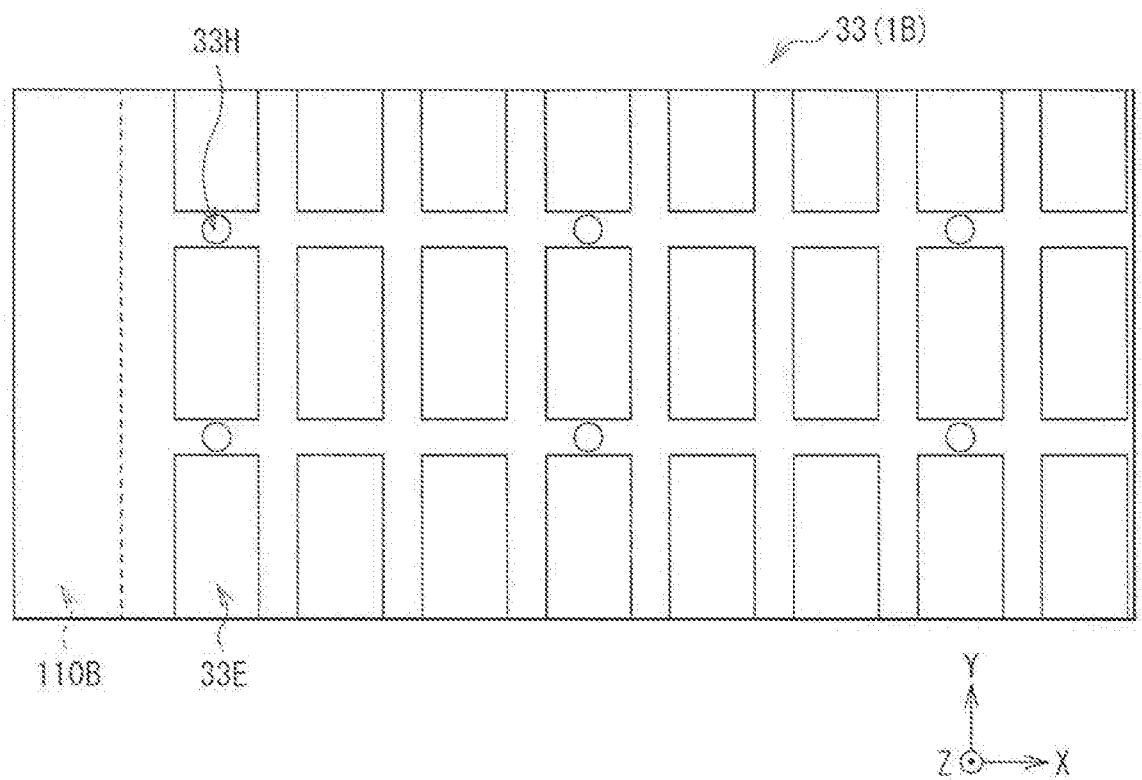
[FIG. 26]
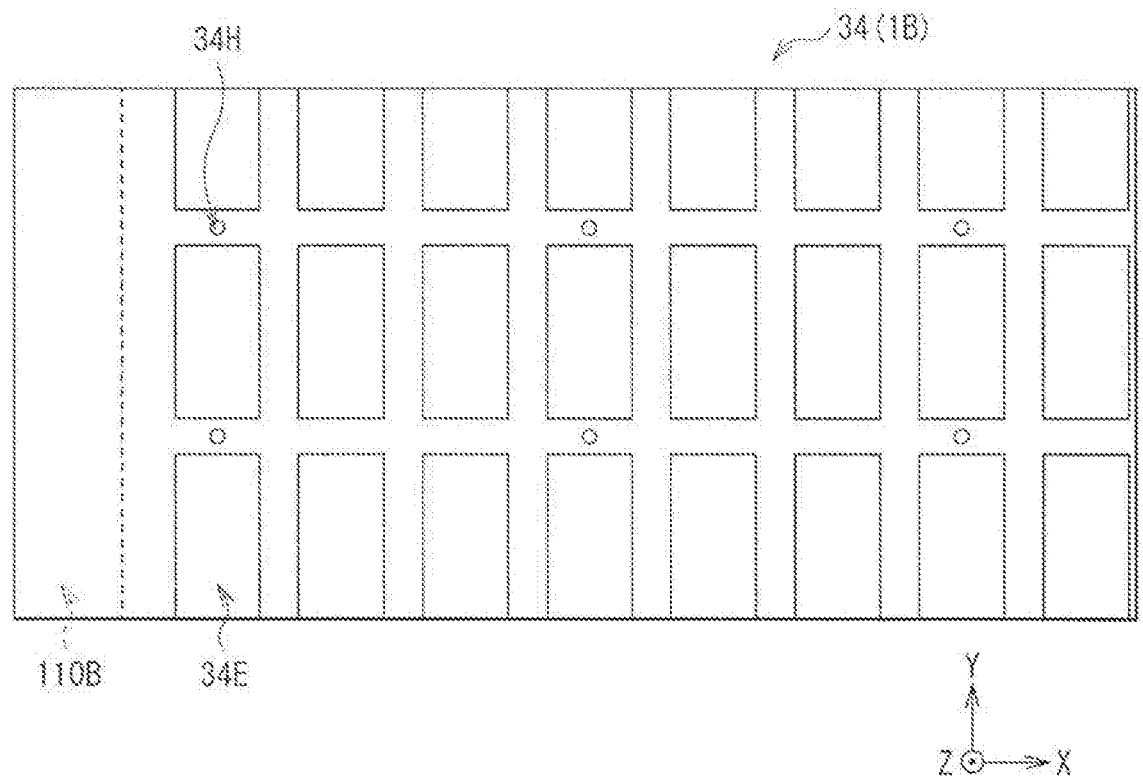

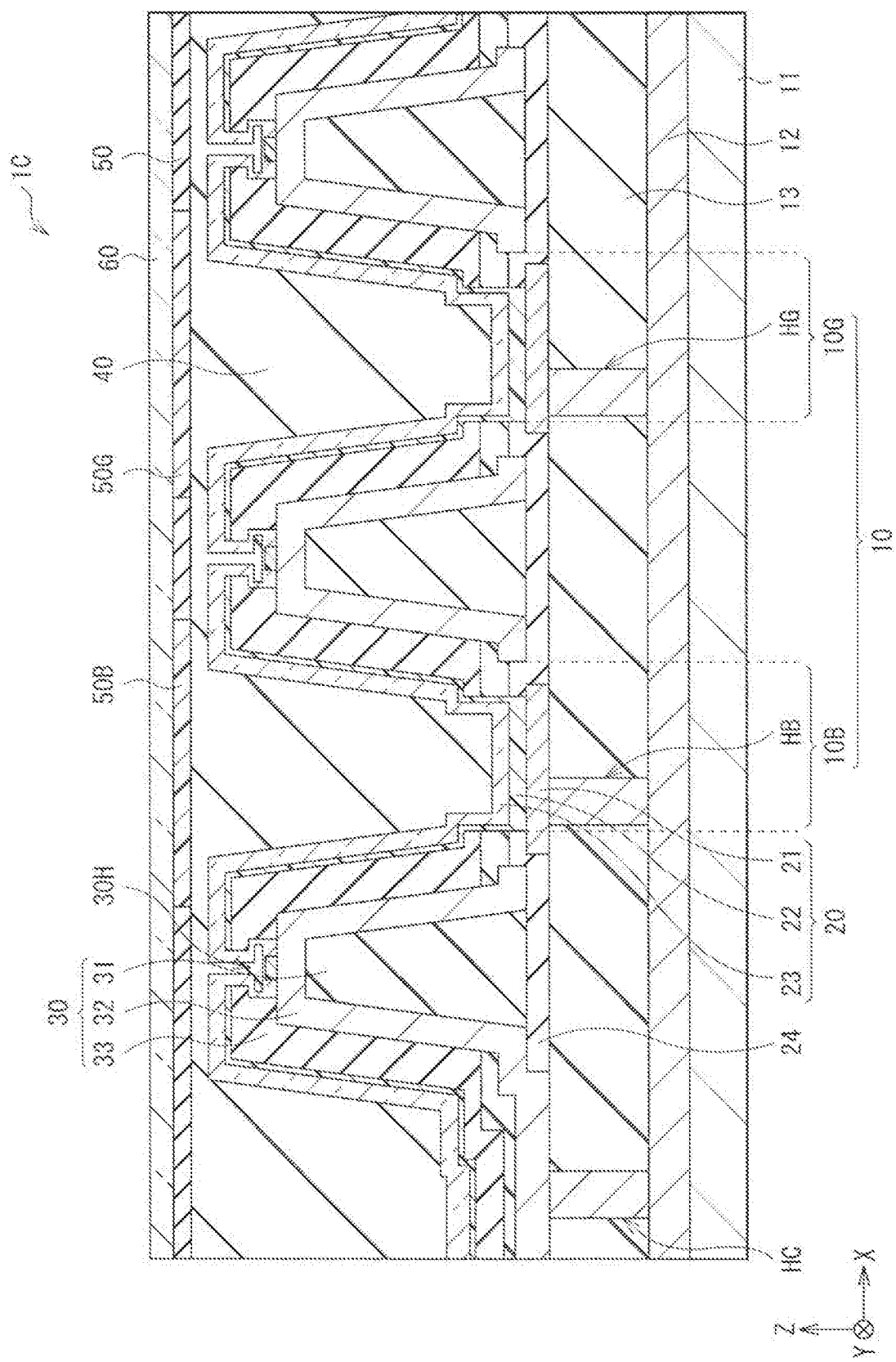

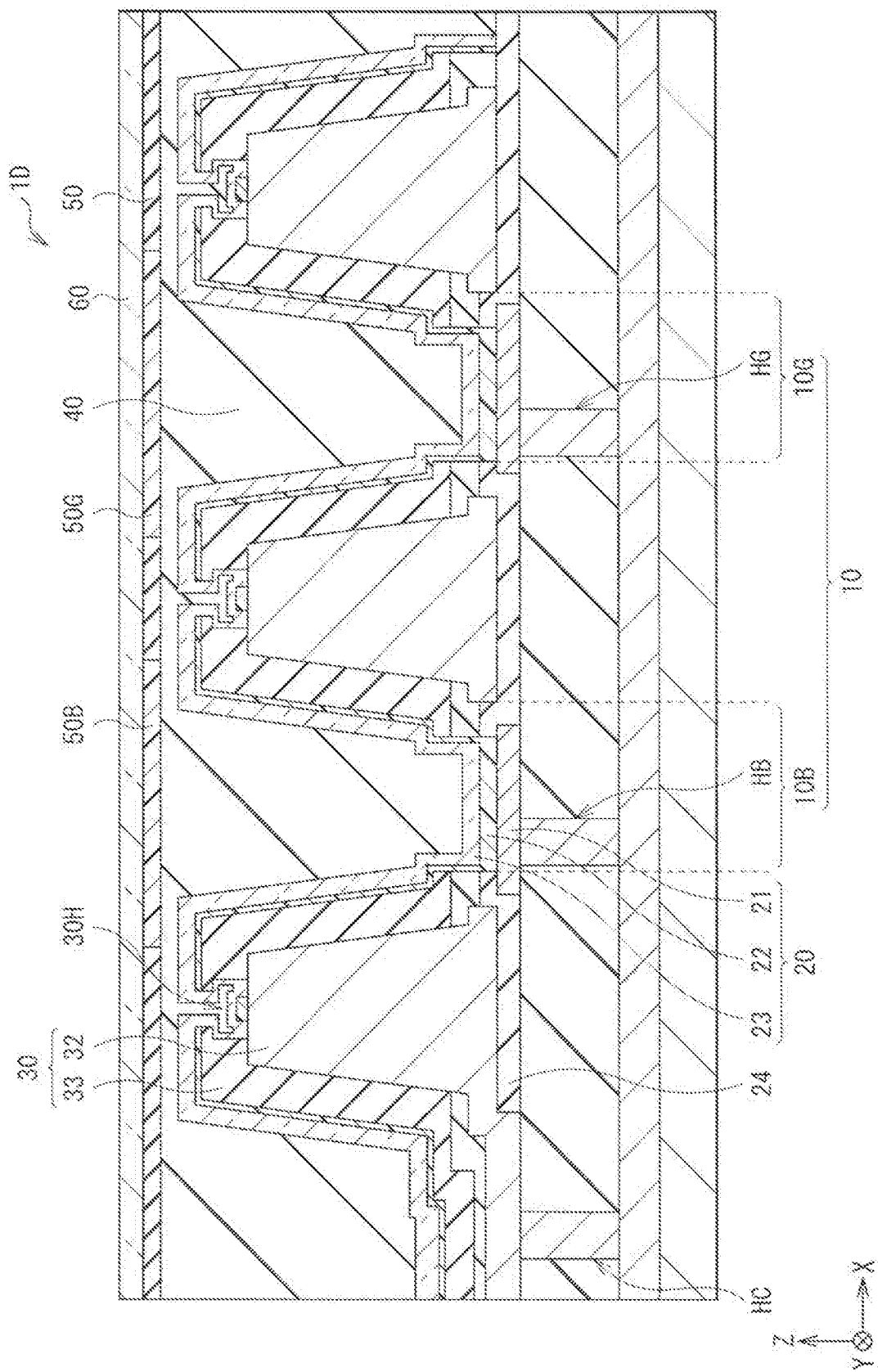
[FIG. 28]

[FIG. 29]
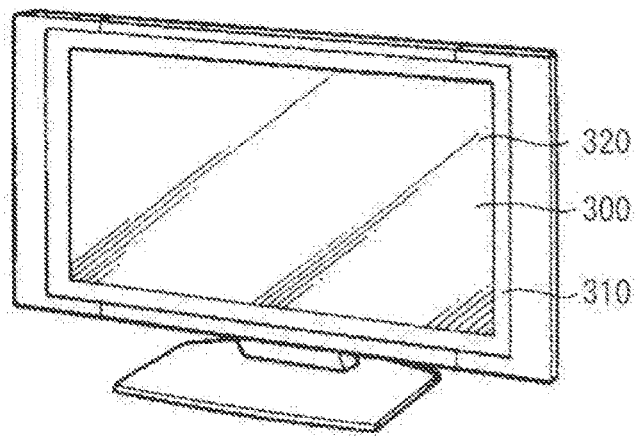
[FIG. 30]
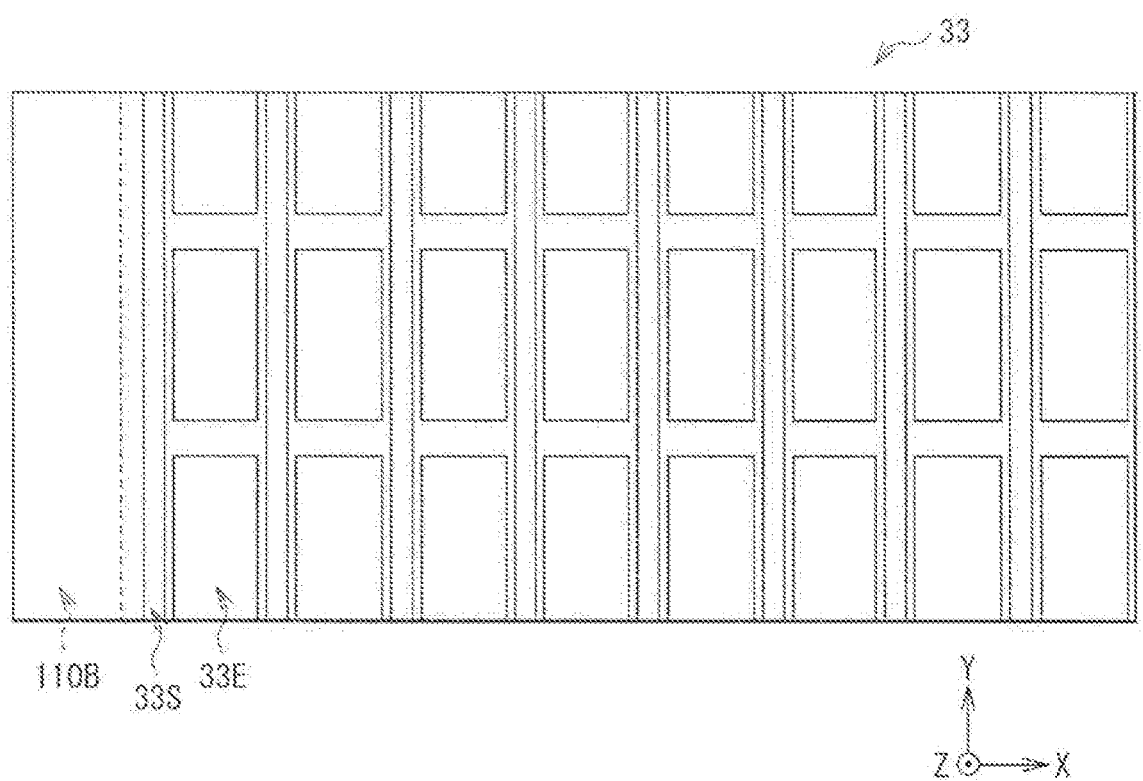

[FIG. 31]
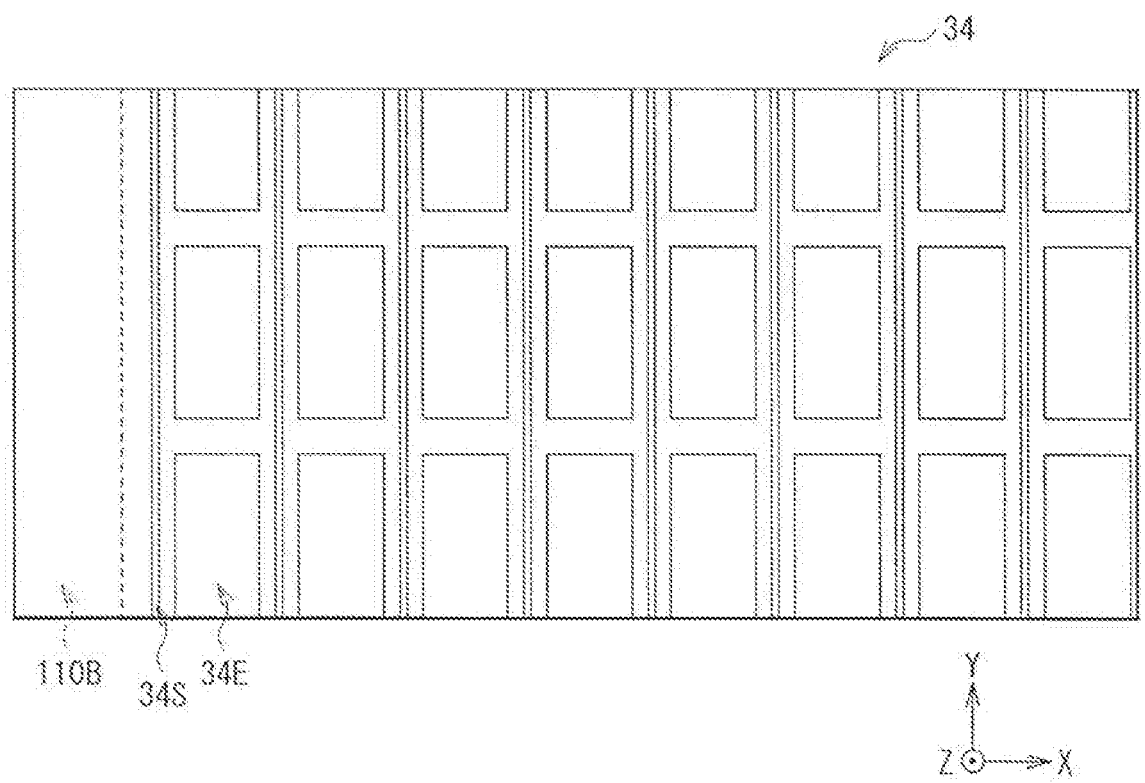

DISPLAY UNIT AND ELECTRONIC APPARATUS

CROSS REFERENCE TO RELATED APPLICATIONS

The present application is a continuation application of U.S. patent application Ser. No. 15/502,258, filed Feb. 7, 2017, which is a National Stage Entry of PCT/JP2015/071593, filed Jul. 30, 2015, and claims the benefit of Japanese Priority Patent Application JP 2014-166662 filed Aug. 19, 2014, the entire content of which is incorporated herein by reference.

TECHNICAL FIELD

The present technology relates to a display unit and an electronic apparatus that include light-emitting elements each having an organic layer.

BACKGROUND ART

An organic EL (Electroluminescence) display with use of self-emitting type light-emitting elements that include organic layers thereon has a wider viewing angle as compared with a liquid crystal display, and further has sufficient response performance to high-definition and high-speed video signals.

For the organic EL display, as a method of improving light extraction efficiency, there is proposed a method that provides a reflector structure at a periphery of a light-emitting section in which light-emitting elements are provided (for example, see PTL 1).

CITATION LIST

Patent Literature

[PTL 1] Japanese Unexamined Patent Application Publication No. 2011-023240

SUMMARY OF THE INVENTION

In such an organic EL display, it is desired to improve the light extraction efficiency, and to improve luminance by increasing a signal amount (for example, a current amount) to be transmitted to the light-emitting elements.

Accordingly, it is desirable to provide a display unit and an electronic apparatus that have high luminance.

A display unit according to an embodiment of the present technology includes: a light-emitting section including a light-emitting element that has a first electrode, an organic layer including a light-emitting layer, and a second electrode in this order; and a reflector that is provided at a periphery of the light-emitting section to reflect light from the light-emitting section, and has a conductive layer, the conductive layer being electrically coupled to the second electrode of the light-emitting element.

An electronic apparatus according to an embodiment of the present technology includes the above-described display unit.

In the display unit and the electronic apparatus according to the respective embodiments of the present technology, since the conductive layer of the reflector is electrically coupled to the second electrode of the light-emitting element, the conductive layer of the reflector is used along with the second electrode, and a signal is transmitted to the light-emitting element.

According to the display unit and the electronic apparatus of the respective embodiments of the present technology, the conductive layer of the reflector is electrically coupled to the second electrode of the light-emitting element, which makes it possible to increase an amount of signals flowing through the light-emitting element. This allows for improvement in luminance. It is to be noted that effects described here are non-limiting, and may be one or more of effects described in the present disclosure.

BRIEF DESCRIPTION OF THE DRAWINGS

FIG. 1 is a plan view of a configuration of a display unit according to an embodiment of the present technology.

FIG. 2 is an enlarged plan view of a portion of the display unit illustrated in FIG. 1.

FIG. 3 is a diagram illustrating a cross-sectional configuration taken along a line III-III illustrated in FIG. 2.

FIG. 4 is a diagram illustrating a cross-sectional configuration taken along a line IV-IV illustrated in FIG. 2.

FIG. 5 is a plan view of a configuration of a conductive layer of a reflector illustrated in FIG. 3 and FIG. 4.

FIG. 6 is a plan view of a configuration of a first dielectric layer of the reflector illustrated in FIG. 3 and FIG. 4.

FIG. 7 is a plan view of a configuration of a second dielectric layer of the reflector illustrated in FIG. 3 and FIG. 4.

FIG. 8 is a plan view of another configuration of the first dielectric layer illustrated in FIG. 6.

FIG. 9 is a plan view of another configuration of the second dielectric layer illustrated in FIG. 7.

FIG. 10 is a schematic diagram illustrating an overall configuration of the display unit illustrated in FIG. 1.

FIG. 11 is a diagram illustrating an example of a pixel driving circuit illustrated in FIG. 10.

FIG. 12 is a cross-sectional view of an example of a manufacturing process of the display unit illustrated in FIG. 3.

FIG. 13 is a cross-sectional view of a process following the process illustrated in FIG. 12.

FIG. 14 is a cross-sectional view of a process following the process illustrated in FIG. 13.

FIG. 15 is a cross-sectional view of a process following on the process illustrated in FIG. 14.

FIG. 16 is a plan view of a configuration of a display unit according to a modification example 1.

FIG. 17 is a diagram illustrating a cross-sectional configuration taken along a line XVII-XYII illustrated in FIG. 16.

FIG. 18 is a diagram illustrating a cross-sectional configuration taken along a line XVIII-XYIII illustrated in FIG. 16.

FIG. 19 is a plan view of a configuration of a first dielectric layer of a reflector illustrated in FIG. 17 and FIG. 18.

FIG. 20 is a plan view of a configuration of a second dielectric layer of the reflector illustrated in FIG. 17 and FIG. 18.

FIG. 21 is a plan view of another configuration of the first dielectric layer illustrated in FIG. 19.

FIG. 22 is a plan view of another configuration of the second dielectric layer illustrated in FIG. 20.

FIG. 23 is a plan view of a configuration of a first dielectric layer of a display unit according to a modification example 2.

FIG. 24 is a plan view of a configuration of a second dielectric layer of the display unit according to the modification example 2.

FIG. 25 is a plan view of another example of a configuration of the first dielectric layer illustrated in FIG. 23.

FIG. 26 is a plan view of another example of a configuration of the second dielectric layer illustrated in FIG. 24.

FIG. 27 is a cross-sectional view of a configuration of a display unit according to a modification example 3.

FIG. 28 is a cross-sectional view of a configuration of a display unit according to a modification example 4.

FIG. 29 is a perspective view of an application example of the display unit illustrated in FIG. 1 and other related figures.

FIG. 30 is a plan view of another example of a configuration of the first dielectric layer illustrated in FIG. 8 and other related figures.

FIG. 31 is a plan view of another example of a configuration of the second dielectric layer illustrated in FIG. 9 and other related figures.

MODES FOR CARRYING OUT THE INVENTION

Hereinafter, some embodiments of the present technology are described in detail with reference to the drawings. It is to be noted that description is given in the following order.
1. Embodiment (a display unit: an example where a reflector includes a support, a conductive layer, and two dielectric layers)
2. Modification Example 1 (a disposition example 1 of connection holes of a dielectric layer)
3. Modification Example 2 (a disposition example 2 of connection holes of a dielectric layer)
4. Modification Example 3 (an example where a reflector includes a support, a conductive layer, and a single dielectric layer)
5. Modification Example 4 (an example where a reflector includes a conductive layer and a single dielectric layer)
6. Application Examples

Example Embodiment

[Configuration of Display Unit 1]

FIG. 1 schematically illustrates a planar configuration of an organic EL display unit (display unit 1) according to an embodiment of the present technology. The display unit 1 may include a substrate 11 having a display region 110A at a central portion and a peripheral region 110B outside the display region 11A. The peripheral region 110B may surround the display region 110A, and a common electrode 12C may be provided in the peripheral region 110B on the substrate 11. The common electrode 12C may be provided, for example, in a frame shape surrounding the rectangular display region 110A. The common electrode 12C may be coupled to a common power source line (GND), for example. It is only necessary to provide the common electrode 12C in the peripheral region 110B, and the common electrode 12C may not surround the display region 110A.

FIG. 2 is an enlarged view of a portion P in FIG. 1. The display region 110A on the substrate 11 may be provided with a plurality of light-emitting sections 10. The light-emitting sections 10 may each include, for example, a red light-emitting section 10R that emits red light, a green light-emitting section 10G that emits green light, and a blue light-emitting section 10B that emits blue light. The red light-emitting sections 10R, the green light-emitting sections 10G, and the blue light-emitting sections 10B may each have, for example, a rectangular shape, and may be disposed in a matrix pattern in a row direction (X direction) and in a column direction (Y direction). Alternatively, the red light-emitting section 10R, the green light-emitting section 10G, and the blue light-emitting section 10B may each have, for example, a circular shape (not illustrated).

FIG. 3 illustrates a cross-sectional configuration taken along a line III-III illustrated in FIG. 2, and FIG. 4 illustrates a cross-sectional configuration taken along a line IV-IV illustrated in FIG. 2.

The display unit 1 may have a TFT (Thin-Film Transistor) layer 12 and an interlayer insulating film 13 on the substrate 11. In each of the red light-emitting sections 10R, the green light-emitting sections 10G, and the blue light-emitting sections 10B, a light-emitting element 20 may be provided on the interlayer insulating film 13. At a periphery of each of the red light-emitting sections 10R, the green light-emitting sections 10G, and the blue light-emitting sections 10B, a reflector 30 may be provided on the interlayer insulating film 13. FIG. 3 does not illustrate the red light-emitting sections 10R; however, the light-emitting element 20 of each of the red light-emitting sections 10R may have a configuration similar to a configuration of each of the light-emitting section 10G and the blue light-emitting section 10B. The light-emitting element 20 has a first electrode 21, an organic layer 22 including a light-emitting layer, and a second electrode 23 in order from a position close to the interlayer insulating film 13. An inter-pixel insulating film 24 may be provided between adjacent two of the light-emitting elements 20. The reflector 30 may have a support 31, a conductive layer 32, a first dielectric layer 33, and a second dielectric layer 34 in order from a position close to the interlayer insulating film 13. The light-emitting elements 20 and the reflector 30 may be covered with a filler layer 40, and may be sealed between the substrate 11 and a sealing substrate 60 having a CF (Color Filter) layer 50. Such a display unit 1 may be, for example, a top-emission type display unit, in which light generated in the light-emitting element 20 is taken out of the sealing substrate 60.

The substrate 11 may be made of, for example, a glass or plastic material that makes it possible to block permeation of moisture (water vapor) and oxygen. The substrate 11 may be a support in which a plurality of pixels 5 are disposed to be arrayed on one principal surface thereof. Examples of a constituent material of the substrate 11 may include a glass substrate such as high-strain-point glass, soda glass ($Na_2O.CaO.SiO_2$), borosilicate glass ($Na_2O.B_2O_3.SiO_2$), forsterite ($2MgO.SiO_2$), and lead glass ($Na_2O.PbO.SiO_2$); a quartz substrate; or a silicon substrate. The substrate 11 may be configured by providing an insulating film on a surface of one of such a glass substrate, quartz substrate, and silicon substrate. Alternatively, it may be possible to use a film or a sheet made of a metallic foil or a resin for the substrate 11. Examples of the resin may include an organic polymer such as polymethylmethacrylate (polymethacrylic acid methyl, PMMA), polyvinyl alcohol (PVA), polyvinyl phenol (PVP), polyether sulfone (PES), polyimide, polycarbonate, polyethylene terephthalate (PET), and polyethylene naphthalate (PEN). It is to be noted that, in the top-emission type, light is taken out of the sealing substrate 60 to be hereinafter described, and therefore the substrate 11 may be made of either a permeable material or a non-permeable material. The sealing substrate 60 may use a material that is the same as or different from the material of the substrate 11. Further, the substrate 11 may be made of a flexible material.

The TFT layer 12 may have a stacked structure of a gate insulating film and a planarizing layer, for example. A drive transistor Tr1 and a write transistor Tr2 that configure a pixel driving circuit (later-described pixel driving circuit 140 in FIG. 10) may be formed in the TFT layer 12. Further signal lines (later-described signal lines 120A in FIG. 10), scan lines (later-described scan lines 130A in FIG. 10), and the common electrode 12C may be embedded in the TFT layer 12. Specifically, gate electrodes of the drive transistor Tr1 and the write transistor Tr2 may be formed on the substrate 11, and such gate electrodes may be covered collectively with the gate insulating film. A semiconductor layer, a source electrode, and a drain electrode in each of the drive transistor Tr1 and the write transistor Tr2 may be formed on the gate insulating film.

The planarizing layer that is stacked on the gate insulating film may be provided to planarize a surface of the TFT layer 12 mainly, and may be made of an insulating resin material such as polyimide, for example. If sufficient flatness is obtained with use of the gate insulating film, the planarizing layer may be omitted alternatively.

The first electrode 21 may also serve as a reflective layer, for example, and may preferably include a material having high reflectance and a high hole-injecting property. For example, a conductive material with a thickness within a range of 100 nm to 300 nm both inclusive may be used for such a first electrode 21. Examples of a constituent material for the first electrode 21 may include simple substances of metal elements such as chromium (Cr), gold (Au), platinum (Pt), nickel (Ni), copper (Cu), molybdenum (Mo), tungsten (W), titanium (Ti), tantalum (Ta), aluminum (Al), iron (Fe), and silver (Ag), and alloys of the metal elements. The first electrode 21 may be configured by stacking a plurality of such metallic films. Alternatively, the first electrode 21 may be configured with use of a conductive material having a high light-transmission property, and a reflective layer may be provided between the substrate 11 and the first electrode 21. The first electrode 21 that is provided in the light-emitting section 10B may be electrically coupled to the drive transistor Tr1 of the TFT layer 12 via a connection hole HB that is provided in the interlayer insulating film 13, and the first electrode 21 that is provided in the light-emitting section 10G may be electrically coupled to the drive transistor Tr1 of the TFT layer 12 via a connection hole HG that is provided in the interlayer insulating film 13.

The inter-pixel insulating film 24 may serve to assure an insulation property between the first electrode 21 and the second electrode 23, and to segment and separate a light-emitting region each of the light-emitting elements 20. The inter-pixel insulating film 24 may be made of a resin material such as polyimide, an acrylic resin, or a novolac-based resin. As an alternative, the inter-pixel insulating film 24 may be configured by stacking an inorganic insulating material such as silicon oxide ($SiO_2$) and silicon nitride ($Si_3N_4$), and a resin material.

The organic layer 22 is provided between the first electrode 21 and the second electrode 23. The organic layer 22 has an identical structure irrespective of emission colors of the light-emitting sections 10 (red light-emitting section 10R, green light-emitting section 10G, and blue light-emitting section 10B), and may be configured, for example, in such a manner that a hole injection layer, a hole transport layer, a light-emitting layer, an electron transport layer, and an electron injection layer are stacked in this order from a position close to the first electrode 21. Applying an electric field causes some of holes injected from the first electrode 21 via the hole injection layer and the hole transport layer and some of electrons injected from the second electrode 23 via the electron injection layer and the electron transport layer to be recombined in the light-emitting layer, resulting in generation of light. The organic layer 22 may be, for example, common to all of the light-emitting elements 20 to cover the reflector 30.

The hole injection layer may be a buffer layer to improve the hole injection efficiency by allowing holes (carriers) to pass therethrough, and to prevent leakage. The hole injection layer may have, for example, a thickness of 5 nm to 300 nm both inclusive, and may include hexaazatriphenylene derivative that is represented by Chemical Expression 1 or Chemical Expression 2.

[Chemical Expression 1]

(In Chemical Expression 1, each of R1 to R6 is a substituent group that is independently selected from hydrogen, a halogen, a hydroxyl group, an amino group, an arylamino group, a substituted or unsubstituted carbonyl group having 20 or less carbons, a substituted or unsubstituted carbonyl ester group having 20 or less carbons, a substituted or unsubstituted alkyl group having 20 or less carbons, a substituted or unsubstituted alkenyl group having 20 or less carbons, a substituted or unsubstituted alkoxyl group having 20 or less carbons, a substituted or unsubstituted aryl group having 30 or less carbons, a substituted or unsubstituted heterocyclic group having 30 or less carbons, a nitrile group, a cyano group, a nitro group, and a silyl group, adjacent Rm (m is 1 to 6) are optionally bonded to one another through a ring structure, and each of X1 to X6 is an independent carbon atom or nitrogen atom.)

[Chemical Expression 2]

The hole transport layer may serve to improve efficiency of hole transport to the light-emitting layer. The hole transport layer may have a thickness of about 40 nm, and may be made of 4,4',4"-tris (3-methylphenyl phenylamino) triphenylamine (m-MTDATA) or α-naphthylphenyldiamine (αNPD). Any material having the hole transport function may be selected for the hole injection layer.

The light-emitting layer is a light-emitting layer for white light emission, and may have, for example, a red light-emitting layer, a green light-emitting layer, and a blue light-emitting layer (none of them are illustrated) that are provided to be stacked between the first electrode 21 and the second electrode 23. The red light-emitting layer, the green light-emitting layer, and the blue light-emitting layer respectively emit red light, green light, and blue light through recombination of holes and electrons.

The red light-emitting layer may include, for example, one or more kinds of a red light-emitting material, a hole transporting material, an electron transporting material, and a positive and negative charge transporting material. The red light-emitting material may be either fluorescent or phosphorescent. The red light-emitting layer may have, for example, a thickness of about 5 nm, and may be made of a material in which 2,6-bis [(4'-methoxydiphenylamino) styryl]-1,5-dicyanonaphthalene (BSN) is mixed with 4,4-bis (2,2-diphenylvinyl) biphenyl (DPVBi) at a rate of 30% by weight.

The green light-emitting layer may include, for example, one or more kinds of a green light-emitting material, a hole transporting material, an electron transporting material, and a positive and negative charge transporting material. The green light-emitting material may be either fluorescent or phosphorescent. The green light-emitting layer may have, for example, a thickness of about 10 nm, and may made of a material in which coumarin 6 is mixed with DPVBi at a rate of 5% by weight.

The blue light-emitting layer may include, for example, one or more kinds of a blue light-emitting material, a hole transporting material, an electron transporting material, and a positive and negative charge transporting material. The blue light-emitting material may be either fluorescent or phosphorescent. The blue light-emitting layer may have, for example, a thickness of about 30 nm, and may made of a material in which 4,4'-bis [2-{4-(N,N-diphenylamino) phenyl} vinyl] biphenyl (DPAVBi) at a rate of 2.5% by weight.

The electron transport layer may serve to improve efficiency of electron transport to the light-emitting layer, and may be made of, for example, 8-hydroxyquinoline aluminum (Alq3) having a thickness of about 20 nm. The electron injection layer may be intended to improve the efficiency of electron injection into the light-emitting layer 16, and may be made of, for example, LiF or $Li_2O$ having a thickness of about 0.3 nm.

The second electrode 23 makes a pair with the first electrode 21 with the organic layer 22 in between, and is provided common to all of the light-emitting elements 20 on the electron injection layer in a state of being insulated from the first electrode 21. The second electrode 23 may include, for example, a transparent material having a light-transmission property. Specifically, an alloy material of aluminum (Al), magnesium (Mg), silver (Ag), calcium (Ca), or sodium (Na) may be usable for the second electrode 23. In particular, an alloy of magnesium and silver (Mg—Ag alloy) may be preferable because the Mg—Ag alloy in a thin film form combines conductivity with small absorptivity. A ratio of magnesium to silver in the Mg—Ag alloy is not limited specifically; however, a film thickness ratio of Mg to Ag may be preferably within a range of 20:1 to 1:1. Alternatively, for a material of the second electrode 23, an alloy of aluminum (Al) and lithium (Li) (Al—Li alloy) may be usable, or a material such as indium tin oxide (ITO), zinc oxide (ZnO), alumina-doped zinc oxide (AZO), gallium-doped zinc oxide (GZO), indium zinc oxide (IZO), indium titanium oxide (ITiO), or indium tungsten oxide (IWO) may be usable. Specifically, for example, the Mg—Ag alloy having a thickness within a range of 10 nm to 30 nm both inclusive, or IZO having a thickness within a range of 20 nm to 200 nm both inclusive may be usable for the second electrode 23. As with the organic layer 22, the second electrode 23 may be, for example, common to all of the light-emitting elements 20 to cover the reflector 30.

The reflector 30 is provided to surround circumferences of the light-emitting sections 10, and reflects light that is generated by the light-emitting elements 20. Providing such a reflector 30 enhances extraction efficiency of the light that is generated by the light-emitting elements 20, thereby improving luminance of the display unit 1. The support 31 of the reflector 30 is provided on the inter-pixel insulating film 24. The support 31 may serve to shape the reflector 30 in a desired form, and may be shaped in a bulkhead form that surrounds the light-emitting sections 10. A thickness (width) of the support 31 may be, for example, greater at a position closer to the inter-pixel insulating film 24, and may become smaller as the support 31 comes closer to the sealing substrate 60. In other words, the support 31 may be shaped in such a manner that a cross-sectional shape thereof has a tapered form. Providing such a support 31 (reflector 30) having a cross-sectional surface of a tapered shape makes it possible to improve light extraction efficiency from the sealing substrate 60 side. The support 31 may be made of, for example, an ultraviolet curable resin or a thermosetting resin. Alternatively, a material similar to a constituent material for the above-described inter-pixel insulating film 24 may be usable for the support 31, or the support 31 and the inter-pixel insulating film 24 may be integrated together. For example, when the first electrode 21 has a circular shape with a radius of 10 μm, a height (a distance in Z direction) of the support 31 may be, for example, 10 μm. The height of the support 31 may be adjusted as appropriate depending on a size, shape, pitch, and any other factor of the first electrode 21.

The conductive layer 32 may have, for example, a thickness within a range of 50 nm to 200 nm both inclusive, and may cover the support 31 to be tailored to the shape of the support 31. The conductive layer 32 may serve to efficiently reflect the light from the light-emitting sections 10 toward display surface side, and may be preferably made of a metallic material having high reflectance for the light that is generated by the light-emitting elements 20. Specifically, a constituent material for the conductive layer 32 may preferably include silver (Ag) or aluminum (Al) or both. Alternatively, the conductive layer 32 may be configured using a simple substance of silver or aluminum, or the conductive layer 32 may be configured using an alloy that contains a mixture of silver and aluminum as a major ingredient. In the present embodiment, the conductive layer 32 may be electrically coupled to the second electrode 23 of the light-emitting element 20. As will hereinafter be described in detail, this increases an amount of signals flowing through the light-emitting elements 20, thereby improving the luminance of the light-emitting elements 20.

FIG. 5 illustrates a planar shape of the conductive layer 32. The single conductive layer 32 may be provided continuously in the display unit 1. In the display region 110A of the substrate 11, a plurality of apertures 32E may be provided in the conductive layer 32. Each of the apertures 32E may be, for example, in a rectangular shape, and may be provided at a location overlapping with the light-emitting section 10. In the aperture 32E, an end surface of the conductive layer 32 may be covered with the first dielectric layer 33, the second dielectric layer 34, and the inter-pixel insulating film 24, and the conductive layer 32 may be insulated from the first electrode 21. The conductive layer 32 may extend to the peripheral region 110B on the substrate 11, and may be electrically coupled to the common electrode 12C through a connection hole HC that is provided in the interlayer insulating film 13 of the peripheral region 110B (FIG. 3). In other words, the second electrode 23 of the light-emitting element 20 may be electrically coupled to the common electrode 12C through the conductive layer 32.

The first dielectric layer 33 and the second dielectric layer 34 that are stacked on the conductive layer 32 may be provided with connection holes 30H, and the second electrode 23 that covers the reflector 30 may be electrically coupled to the conductive layer 32 through the connection hole 30H. The organic layer 22 may be disrupted in the vicinity of the connection hole 30H, and, for example, a portion of the organic layer 22 may be locally attached to the conductive layer 32 at the bottom of the connection hole 30H. The second electrode 23 may cover a wall surface of the connection hole 30H along with a disrupted surface (end surface) of the organic layer 22, and may be provided continuously until reaching the bottom of the connection hole 30H. The second electrode 23 may wrap around the whole bottom of the connection hole 30H to be in contact with the conductive layer 32. Each of the first dielectric layer 33 and the second dielectric layer 34 may have an overhanging structure in the vicinity of the connection hole 30H, and the bottom of the connection hole 30H (in the vicinity of the conductive layer 32) may be larger in size than an inlet thereof (in the vicinity of the first dielectric layer 33).

FIG. 6 and FIG. 7 respectively illustrate planar configurations of the first dielectric layer 33 and the second dielectric layer 34. The connection hole 30H may include a connection hole 33H of the first dielectric layer 33 and a connection hole 34H of the second dielectric layer 34. Each of the connection holes 33H and 34H may be, for example, in a circular shape, and the connection hole 33H of the first dielectric layer 33 may be larger in size than the connection hole 34H of the second dielectric layer 34. In the display region 110A on the substrate 11, along with those connection holes 33H and 34H, a plurality of apertures 33E may be provided in the first dielectric layer 33, and a plurality of apertures 34E may be provided in the second dielectric layer 34. Each of the apertures 33E and 34E may be, for example, in a rectangular shape, and may be provided at a location overlapping with the aperture 32E of the conductive layer 32, that is, the light-emitting section 10. Each of the connection holes 33H and 34H may be provided a clearance between two adjacent light-emitting sections 10 in a row direction of the light-emitting sections 10, for example.

The connection holes 33H and 34H may be provided in all of clearances between the light-emitting sections 10 that are adjacent to each other in the row direction (FIG. 6 and FIG. 7), or may be provided in some of the clearances between the light-emitting sections 10 that are adjacent to each other in the row direction, as illustrated in FIG. 8 and FIG. 9.

Each of the first dielectric layer 33 and the second dielectric layer 34 may be made of, for example, an inorganic material such as silicon oxide ($SiO_2$), silicon nitride ($Si_3N_4$), titanium oxide ($TiO_2$), zirconium oxide, aluminum oxide, zinc oxide, and indium oxide. A transparent (high-light-transmissive) insulating material may be preferably used for each of the first dielectric layer 33 and the second dielectric layer 34. A constituent material for the first dielectric layer 33 and a constituent material for the second dielectric layer 34 may be preferably subjected to dry etching under a predetermined condition at different etching speed. Specifically, the constituent material for the first dielectric layer 33 may be etched faster than the constituent material for the second dielectric layer 34. This makes it possible to form the connection holes 33H and 34H with different sizes. A refractive index (n34) of the second dielectric layer 34 may be preferably greater than a refractive index (n33) of the first dielectric layer 33 (n34>n33). For example, the first dielectric layer 33 may be made of silicon oxide, and the second dielectric layer 34 may be made of silicon nitride.

The filler layer 40 between the substrate 11 and the sealing substrate 60 may serve to prevent entry of moisture, and to enhance mechanical strength of the display unit 1. The filler layer 40 may have a light transmission rate of about 80%, and a thickness within a range of 3 μm to 20 μm both inclusive, for example. A material such as an epoxy resin or an acrylic resin may be usable for the filler layer 40. A refractive index (n40) of the filler layer 40 may be preferably greater than the refractive index (n34) of the second dielectric layer 34 (n40>n34).

A CF layer 50 may be provided on a surface that faces the substrate 11 of the sealing substrate 60. The CF layer 50 may include, for example, a red-color filter (not illustrated), a green-color filter 50G, and a blue-color filter 50B, which are respectively disposed corresponding to the red light-emitting section 10R, the green light-emitting section 10G, and the blue light-emitting section 10B. Each of the red-color filter, the green-color filter 50G, and the blue-color filter 50B may be made of a pigment-mixed resin, and may be adjusted by selecting the pigment to increase the light transmission rate at a target red, green, or blue wavelength band, and to decrease the light transmission rate at any other bands.

The CF layer 50 may be provided with, for example, a light-shielding film that fills clearances between the color filters (the red-color filter, the green-color filter 50G, and the blue-color filter 50B). The light-shielding film may be configured of a black resin film with optical density of 1 or more in which a black coloring agent is mixed, or a thin-film filter utilizing interference of a thin film. In particular, the configuration with use of the black resin film may be preferable because this makes it possible to form the light-shielding film more inexpensively and easily. The thin-film filter may be configured by stacking one or more thin films made of, for example, metal, metallic nitride, or metallic oxide to attenuate light utilizing interference of the thin films. A specific example of the thin-film filter may be a filter that is configured by alternately stacking chromium (Cr) and chromium oxide (III) ($Cr_2O_3$).

The sealing substrate 60 may be located at a position on the second electrode 23 side of the light-emitting elements 20, and may serve to seal the light-emitting elements 20 along with an adhesion layer (not illustrated). The sealing substrate 60 may include a material such as glass that is transparent to the light that is generated by the light-emitting elements 20.

FIG. 10 schematically illustrates a configuration of the light-emitting elements 20 and respective circuits that are coupled to the light-emitting elements 20. In the peripheral region 110B of the substrate 11, for example, a signal line driving circuit 120 and a scan line driving circuit 130 that are both drivers for the image display may be provided along with the common electrode 12C (FIG. 1), and these driving circuits may be coupled to the light-emitting elements 20 in the display region 110A.

A pixel driving circuit 140 for driving of the light-emitting elements 20 may be disposed along with the plurality of light-emitting elements 20 in the display region 110A. In the pixel driving circuit 140, a plurality of signal lines 120A may be disposed in a column direction, and a plurality of scan lines 130A may be disposed in a row direction. One of the light-emitting elements 20 may be provided at an intersection between each of the signal lines 120A and each of the scan lines 130A. Both ends of each of the signal lines 120A may be coupled to the signal line driving circuit 120, and both ends of each of the scan lines 130A may be coupled to the scan line driving circuit 130.

The signal line driving circuit 120 may provide a signal voltage of an image signal corresponding to luminance information to be delivered from a signal supply source (not illustrated) to the light-emitting element 20 that is selected through the signal line 120A. The scan line driving circuit 130 may include, for example, a shift register that shifts (transfers) start pulses sequentially in synchronization with incoming clock pulses. Upon writing the image signal to each of the light-emitting elements 20, the scan line driving circuit 130 may scan the light-emitting elements 20 row by row to provide scan signals sequentially to the scan lines 130A. A signal voltage from the signal line driving circuit 120 may be provided to each of the signal lines 120A, and a scan signal from the scan line driving circuit 130 may be provided to each of the scan lines 130A.

FIG. 11 illustrates an example of the pixel driving circuit 140. The pixel driving circuit 140 may be, for example, an active-type driving circuit. Specifically, the pixel driving circuit 140 may include the drive transistor Tr1 and the write transistor Tr2; a capacitor (storage capacitor) Cs between the transistors Tr1 and Tr2; and the light-emitting element 20 that is coupled in series to the drive transistor Tr1 between a first power source line (Vcc) and a second power source line (GND). The first electrode 21 of the light-emitting element 20 may be coupled to a source electrode of the drive transistor Tr1, and the second electrode 22 of the light-emitting element 20 may be coupled to a common power source line (GND). Each of the drive transistor Tr1 and the write transistor Tr2 may be configured of a general-use thin-film transistor. The configuration is not limited specifically, and, for example, an inversely-staggered structure (so-called bottom-gate type) and a staggered structure (so-called top-gate type) may be both applicable.

[Method of Manufacturing Display Unit 1]

The display unit 1 as described above may be manufactured in the following manner, for example.

[Process of Forming TFT Layer 12 and Interlayer Insulating Film 13]

First, the TFT layer 12 is formed on the substrate 11 through a predetermined thin-film process. At this time, the drive transistor Tr1 and the write transistor Tr2 are formed in the display region 110A of the substrate 11, and the common electrode 12C is formed in the peripheral region 110B. Next, the interlayer insulating film 13 is formed over a whole surface of the substrate 11 by, for example, a spin coating method or a slit coating method. Thereafter, the deposited interlayer insulating film 13 is patterned in a predetermined shape by, for example, a lithography method to form the connection holes HG, HB, and HC.

[Process of Forming First Electrode 21]

After the TFT 20 is provided, the first electrode 21 is formed for each of the light-emitting sections 10. The first electrode 21 may be formed, for example, by forming a film of an Al—Nd alloy over the whole surface of the substrate 11 by a spattering method, and thereafter pattering the film with use of, for example, a lithography method.

[Process of Forming Inter-Pixel Insulating Film 24]

Next, for example, a film of a polyimide-based resin is formed over the whole surface of the substrate 11, and thereafter the film is patterned in a desired shape, thereby forming the inter-pixel insulating film 24 in the display region 110A.

[Process of Forming Reflector 30]

Next, as illustrated in FIG. 12, the reflector 30 is formed on the inter-pixel insulating film 24. Specifically, first, for example, a film of a resin material is formed over the whole surface of the substrate 11, and thereafter the film is patterned, thereby forming the support 31 in the display region 110A. Thereafter, for example, a film of silver is formed to cover the support 31, and then the film is patterned to form the apertures (apertures 32E in FIG. 5). This leads to formation of the conductive layer 32. At this time, the film of silver is extended to the peripheral region 110B to be coupled to the connection hole HC. Next, a film of the constituent material of the first dielectric layer 33 and a film of the constituent material of the second dielectric layer 34 are formed on the conductive layer 32, and thereafter these films are patterned to form, the apertures (apertures 33E and 34E illustrated in FIG. 6 and FIG. 7, respectively). This leads to formation of the reflector 30. The first dielectric layer 33 and the second dielectric layer 34 are formed using a material with faster etching speed for the first dielectric layer 33 and using a material with slower etching speed for the second dielectric layer 34 in dry etching under a predetermined condition.

After the reflector 30 is provided, the connection hole 30H is formed in the second dielectric layer 34 and the first dielectric layer 33 of the reflector 30, as illustrated in FIG. 13. The connection hole 30H may be formed by carrying out patterning with use of, for example, a photolithography method and dry etching. In the dry etching process, as described above, the first dielectric layer 33 and the second dielectric layer 34 are formed with use of materials having different etching speed in the dry etching under the predetermined condition, thereby forming larger apertures (apertures 33E in FIG. 6) in on the first dielectric layer 33, and forming smaller apertures (apertures 34E in FIG. 7) in the second dielectric layer 34.

[Process of Forming Organic Layer 22]

After the connection hole 30H is formed in the second dielectric layer 34 and the first dielectric layer 33 of the reflector 30, the organic layer 22 is formed in the display region 110A of the substrate 11, as illustrated in FIG. 14. The organic layer 22 may be formed using, for example, a vacuum evaporation method. The vacuum evaporation method is a method of evaporating a variety of materials on the substrate from evaporation source. A pressure at the time of film formation may be preferably $5\times10^{-4}$ Pa or less. The organic layer 22 is formed on the reflector 30 and the first electrode 21. A portion of the organic layer 22 may tap into the connection hole 30H of the reflector 30, and the organic layer 22 may be attached to the conductive layer 32.

[Process of Forming Second Electrode 23]

After the organic layer 22 is provided, the second electrode 23 with a thickness of 200 nm is formed using, for example, the vacuum evaporation method or a spattering method, as illustrated in FIG. 15. A pressure at the time of film formation may be preferably $1\times10^{-3}$ Pa or more, and may be, for example, 0.3 Pa. At this time, the second electrode 23 is wrapped around a wider range than a range where the organic layer 22 taps the second electrode 23 into the connection hole 30H of the reflector 30 to cause the second electrode 23 to come in contact with the conductive layer 32 and be electrically coupled to the conductive layer 32. The second electrode 23 may be formed utilizing, for example, a CVD (Chemical Vapor Deposition) method or an ALD (Atomic Layer Deposition) method.

[Process of Forming Sealing Substrate 60]

The CF layer may be formed on the sealing substrate 60 in the following manner, for example. First, a film of a constituent material of the light-shielding film is formed over a whole surface of the sealing substrate 60, and thereafter the film is patterned in a matrix form using, for example, a lithography process, thereby forming the plurality of apertures corresponding to the arrangement of the light-emitting sections 10. This leads to formation of the light-shielding film. Next, the red-color filter, the green-color filter 50G, and the blue-color filter 50B are provided at the apertures of the light-shielding film by carrying out patterning of these color filters sequentially. This leads to formation of the CF layer 50.

[Process of Bonding Substrate 11 and Sealing Substrate 60]

The sealing substrate 60 that is formed in the above-described manner is bonded to the substrate 11 with the light-emitting elements 20, the reflector 30, and the filler layer 40 in between using, for example, an ODF (One Drop Fill) process. All of the processes as described above bring the display unit 1 to completion.

[Operation of Display Unit 1]

In the display unit 1, when a drive current corresponding to an image signal of each color is applied to each of the light-emitting elements 20, electrons and holes are injected into the organic layer 22 through the first electrode 21 and the second electrode 23. The electrons and the holes may be recombined in the light-emitting layer included in the organic layer 22 to generate light. At least a portion of the light may be reflected by the reflector 30, and may be transmitted through the CF layer 50 and the sealing substrate 60 to be extracted to the outside. In such a manner, the full-color image display including, for example, R, G, and B colors may be performed in the display unit 1.

[Workings and Effects of Display Unit 1]

Here, in the display unit 1, the conductive layer 32 of the reflector 30 is electrically coupled to the second electrode 23 of the light-emitting element 20, which makes it possible to increase an amount of signals flowing through the light-emitting element 20. Hereinafter, a description is provided on such a matter.

In the organic EL display of an upward-lighting type (top-emission method), a second electrode of a light-emitting element is made of a transparent conductive material, and light from an organic layer is multiply reflected between a first electrode and the second electrode to extract the light from a second substrate (upper side) on the opposite side of a first substrate. The transparent conductive material to be used as the second electrode typically has a higher resistance than a resistance of a metallic material. Therefore, a difference in the amount of signals flowing through the light-emitting element may be made depending on a placement location of the light-emitting element, which may raise the possibility of deterioration in display performance. An increase in the film thickness of the second electrode leads to a decrease in the resistance of the second electrode; however, a visible light transmission rate of the second electrode may be degraded, resulting in deterioration in the light extraction efficiency of the light-emitting element.

To reduce the influence of such a high resistance of the second electrode, a method of using an auxiliary wiring pattern may be considered. The auxiliary wiring pattern may be formed between the adjacent light-emitting sections, for example. It is possible to make more signals flow through the second electrode by coupling the second electrode to a common electrode through the auxiliary wiring pattern that is configured of a metal material with low resistance, resulting in improved display performance.

However, providing the auxiliary wiring pattern may narrow the light-emitting section (aperture). In other words, the auxiliary wiring pattern may block the light extraction, raising the possibility of deterioration in the luminance. In particular, combined use of the auxiliary wiring pattern with a reflector may degrade an aperture rate significantly.

On the contrary, in the display unit 1, since the conductive layer 32 of the reflector 30 is electrically coupled to the second electrode 23 of the light-emitting element 20, the conductive layer 32 is utilized together with the second electrode 23, and a signal such as a current flows through the light-emitting element 20. The conductive layer 32 is electrically coupled to the common electrode 12C, and a current flows through the common electrode 12C from the second electrode 23 via the conductive layer 32. In other words, the reflector 30 of the display unit 1 functions not only as a reflector, but also as an auxiliary wiring pattern. As described above, the display unit 1 eliminates the necessity for providing the auxiliary wiring pattern apart from the reflector 30, which makes it possible to increase the amount of signals flowing through the light-emitting elements 20 without causing deterioration in the aperture rate. Therefore, in the display unit 1, the use of the reflector 30 makes it possible to improve extraction efficiency of the light that is generated by the light-emitting elements 20, and to increase the amount of light emission of the light-emitting elements 20. That is, the display unit 1 allows for generation of light with increased power.

Further, the display unit 1 eliminates the necessity for providing the auxiliary wiring pattern apart from the reflector 30, which makes it possible to simplify manufacturing processes, leading to reduction in costs.

As described above, in the present embodiment, the conductive layer 32 of the reflector 30 is electrically coupled to the second electrode 23 of the light-emitting element 20, which makes it possible to improve the light extraction efficiency, as well as to make high-capacity signals flow through the light-emitting elements 20. This allows for improvement in luminance.

Further, the display unit 1 suppresses reduction in the aperture rate as mentioned above, which allows for microfabrication of the light-emitting sections 10. In a microdisplay, reduction in panel size is achievable, which makes it possible to improve manufacturing efficiency.

Moreover, a current flows through the common electrode 12C from the light-emitting element 20 via the conductive layer 32 of the reflector 30, and therefore no influence is exerted on a driving circuit even if the amount of such a current is large. This makes it possible to achieve uniform light emission inside the display region 110A.

In addition, the refractive index n34 of the second dielectric layer 34 is made greater than the refractive index n33 of the first dielectric layer 33, and the refractive index n40 of the filler layer 40 is made greater than the refractive index n34 of the second dielectric layer 34 (n33<n34<n40). As a result, the light that is generated by the light-emitting elements 20 is totally reflected on a surface of the second dielectric layer 34. This makes it possible to further improve the extraction efficiency of the light that is generated by the light-emitting elements 20.

Hereinafter, a description is provided on modification examples of the above-described embodiment, and any component parts essentially same as those in the above-described embodiment are denoted with the same reference numerals, and related descriptions are omitted as appropriate.

Modification Example 1

FIG. 16 illustrates a planar configuration of a display unit (display unit 1A) according to a modification example 1. FIG. 17 and FIG. 18 respectively illustrate cross-sectional configurations taken along a line XVII-XYII and a line XVIII-XYIII illustrated in FIG. 16. In the display unit 1A, the connection hole 30H may be provided at a different position from the position of the connection hole 30H in the above-described display unit 1. With the exception of this point, the display unit 1A has a configuration similar to the configuration of the display unit 1, and the effects and workings thereof are also similar to those of the display unit 1.

FIG. 19 and FIG. 20 respectively illustrate planar configurations of the first dielectric layer 33 and the second dielectric layer 34 of the reflector 30. The connection holes 33H and 34H may be respectively provided at positions displaced from the apertures 33E and 34E in either of the row direction and the column direction. In other words, the connection hole 30H that is configured of the connection holes 33H and 34H may be disposed at a position displaced from the light-emitting section 10 in either of the row direction and the column direction.

As illustrated in FIG. 21 and FIG. 22, the connection holes 33H may be provided in clearances between the apertures 33E that are adjacent to each other in the row direction, and the connection holes 34H may be provided clearances between the apertures 34E that are adjacent to each other in the row direction. Further, the connection holes 33H and 34H may be respectively provided at positions displaced from the apertures 33E and 34E in either of the row direction and the column direction.

Modification Example 2

In a display unit (display unit 1B) according to a modification example 2, the connection holes 30H for making a connection between the conductive layer 32 of the reflector 30 and the second electrode 23 of the light-emitting element 20 may be provided in clearances between the light-emitting sections 10 that are adjacent to each other in the column direction. With the exception of this point, the display unit 1B has a configuration similar to the configuration of the display unit 1, and the effects and workings thereof are also similar to those of the display unit 1.

FIG. 23 and FIG. 24 respectively illustrate planar configurations of the first dielectric layer 33 and the second dielectric layer 34 in the display unit 1B. The connection holes 33H may be provided in clearances between the apertures 33E that are adjacent to each other in the column direction, and the connection holes 34H may be provided in clearances between the apertures 34E that are adjacent to each other in the column direction. In other words, the connection holes 30H that are each configured of the connection holes 33H and 34H may be disposed in clearances between the light-emitting sections 10 that are adjacent to each other in the column direction.

The connection holes 33H and 34H may be provided in all of the clearances between the light-emitting sections 10 that are adjacent to each other in the column direction (FIG. 23 and FIG. 24), or may be provided in some of the clearances between the light-emitting sections 10 that are adjacent to each other in the row direction, as illustrated in FIG. 25 and FIG. 26. Alternatively, the connection holes 33H and 34H may be provided in clearances between the light-emitting sections 10 that are adjacent to each other in the column direction and in clearances between the light-emitting sections 10 that are adjacent to each other in the row direction.

Modification Example 3

FIG. 27 illustrates a cross-sectional configuration of a main portion of a display unit (display unit 1C) according to a modification example 3. In the display unit 1C, the reflector 30 may be configured of a stacked structure that includes the support 31, the conductive layer 32, and the first dielectric layer 32, and a second dielectric layer (for example, the second dielectric layer 33 in FIG. 3) may be not provided. With the exception of this point, the display unit 1C has a configuration similar to the configuration of the display unit 1, and the effects and workings thereof are also similar to those of the display unit 1.

In the display unit 1C, the connection hole 30H for making a connection between the conductive layer 32 of the reflector 30 and the second electrode 23 of the light-emitting element 20 may be provided at the first dielectric layer 32. As with the connection hole 30H described in the display unit 1, the connection hole 30H may preferably have a bottom that is larger in size than an inlet thereof.

Modification Example 4

FIG. 28 illustrates a cross-sectional configuration of a main portion of a display unit (display unit 1D) according to a modification example 4. In the display unit 1D, the reflector 30 may be configured of a stacked structure that includes the conductive layer 32 and the first dielectric layer 33, and a support (for example, the support 31 in FIG. 3) and a second dielectric layer (for example, the second dielectric layer 33 in FIG. 3) may be not provided. With the exception of this point, the display unit 1D has a configuration similar to the configuration of the display unit 1, and the effects and workings thereof are also similar to those of the display unit 1.

In the reflector 30 of the display unit 1D, a cross-sectional surface the conductive layer 32 may be shaped to have a tapered form. For example, a thickness (width) of the conductive layer 32 may become larger at a position closer to the inter-layer insulating film 24, and may become smaller as the conductive layer 32 comes closer to the sealing substrate 60. As with the connection hole 30H described in the display unit 1, the connection hole 30H that is provided on the first dielectric layer 33 may preferably have a bottom that is larger in size than an inlet thereof. The reflector 30 may be configured by stacking the first dielectric layer 33 and the second dielectric layer on the conductive layer 32 having the tapered cross-sectional surface (not illustrated).

Application Examples

A description is provided on application examples of any of the display units according to the above-described embodiment and the modification examples thereof. Any of the display units according to the above-described embodiment and the modification examples thereof (display units 1, 1A, 1B, 1C, and 1D) may be applicable to electronic apparatuses in every field, such as a television, a digital camera, a notebook personal computer, a mobile terminal including a mobile phone and a smartphone, and a video camera. In other words, any of these display units may be applicable to electronic apparatuses in every field that display image signals to be input externally or internally generated image signals as images or video pictures.

For example, FIG. 29 illustrates an external appearance of a television to which any of the display units according to the above-described embodiment and the modification examples thereof is applied. This television may have, for example, an image display screen section 300 including a front panel 310 and a filter glass 320. The image display screen section 300 is configured of any of the display units according to the above-described embodiment and the modification examples thereof.

The present technology is described thus far with reference to the embodiment and modification examples thereof; however, the present technology is not limited to the above-described embodiment and the modification examples thereof, but various modifications may be made.

For example, in the above-described embodiment and the modification examples thereof, the description is provided by citing specific examples of configurations of the display units 1, 1A, 1B, 1C, and 1D. However, any of the display units 1, 1A, 1B, 1C, and 1D is not limited to the display unit that includes all of the illustrated component parts, and may include any other component parts. Some of the component parts may be replaced with any other component part.

Further, the material and thickness of each layer, or film formation methods and conditions, and any other conditions are not limited to those mentioned in the above-described embodiment and the modification examples thereof, and any other materials and thicknesses, or any other film formation methods and conditions may be permitted.

Moreover, in the above-described embodiment and the modification examples thereof, the description is provided on a case where the connection holes 33H and 34H are provided in the first dielectric layer 33 and the second dielectric layer 34 of the reflector 30, respectively. However, as illustrated in FIG. 30 and FIG. 31, connection grooves 33S and 34S that extend in the column direction may be provided in the first dielectric layer 33 and the second dielectric layer 34, respectively. Alternatively, the connection grooves 33S and 34S may extend in the row direction (not illustrated). When the connection grooves 33S and 34S are provided, the conductive layer 32 of the reflector 30 and the second electrode 23 of the light-emitting element 20 may be coupled to each other through the connection grooves.

In addition, in the above-described embodiment and the modification examples thereof, the description is provided on a case where the organic layer 22 is provided common to all of the light-emitting elements 20; however, a portion or the entirety of the organic layer 22 may be provided for each of the light-emitting elements 20.

It is to be noted that the effects described herein are merely illustrative and non-limiting, and effects achieved by the present technology may be effects other than those described above.

It is to be noted that the present technology may be configured as follows.

(1)
A display unit, including:
a light-emitting section including a light-emitting element that has a first electrode, an organic layer including a light-emitting layer, and a second electrode in this order; and
a reflector that is provided at a periphery of the light-emitting section to reflect light from the light-emitting section, and has a conductive layer, the conductive layer being electrically coupled to the second electrode of the light-emitting element.

(2)
The display unit according to (1), further including:
a substrate having a display region and a peripheral region, the display region in which the light-emitting element and the reflector are provided, and the peripheral region being disposed outside the display region;
a common electrode that is provided in the peripheral region of the substrate,
wherein the conductive layer of the reflector extends to the peripheral region to be electrically coupled to the common electrode.

(3)
The display unit according to (1) or (2), wherein the reflector includes a dielectric layer that is stacked on the conductive layer.

(4)
The display unit according to (3), wherein
the light-emitting element includes a plurality of light-emitting elements, and
the light-emitting layer and the second electrode of the light-emitting element are provided common to the plurality of light-emitting elements to cover the reflector.

(5)
The display unit according to (4), wherein the second electrode of the light-emitting element is electrically coupled to the conductive layer through a connection hole that is provided in the dielectric layer.

(6)
The display unit according to (5), wherein a bottom of the connection hole is larger in size than an inlet of the connection hole.

(7)
The display unit according to (6), wherein the dielectric layer includes a first dielectric layer and a second dielectric layer that have different etching speed in dry etching under a predetermined condition.

(8)
The display unit according to (7), wherein the reflector has a bulkhead-shaped support surrounding the light-emitting section, and the conductive layer, the first dielectric layer, and the second dielectric layer are stacked on the support in this order.

(9)
The display unit according to (8), wherein the connection hole is configured of a first connection hole and a second connection hole, the first connection hole being provided in the first dielectric layer, and the second connection hole being provided in the second dielectric layer and being smaller than the first connection hole.

(10)
The display unit according to any one of (6) to (9), wherein, in the connection hole, the organic layer is attached to the conductive layer, and the second electrode is in contact with the conductive layer around the organic layer attached to the conductive layer.

(11)
The display unit according to any one of (5) to (10), wherein
the light-emitting section comprises a plurality of light-emitting sections disposed in a matrix pattern, and
the connection hole of the dielectric layer is provided in each of clearances between the light-emitting sections that are adjacent to each other in a row direction or a column direction or both.

(12)
The display unit according to any one of (5) to (10), wherein
the light-emitting section comprises a plurality of light-emitting sections disposed in a matrix pattern, and
the connection hole of the dielectric layer is provided at a position displaced from each of the light-emitting section in either of a row direction and a column direction.

(13)
The display unit according to (7), wherein the light-emitting section and the reflector are covered with a filler.

(14)
The display unit according to (13), wherein a refractive index of the filler is greater than a refractive index of the second dielectric layer, and the refractive index of the second dielectric layer is greater than a refractive index of the first dielectric layer.

(15)
The display unit according to any one of (1) to (14), wherein the conductive layer includes silver or aluminum or both.

(16)
An electronic apparatus provided with a display unit, the display unit including:

a light-emitting section including a light-emitting element that has a first electrode, an organic layer including a light-emitting layer, and a second electrode in this order; and a reflector that is provided at a periphery of the light-emitting section to reflect light from the light-emitting section, and has a conductive layer, the conductive layer being electrically coupled to the second electrode of the light-emitting element.

This application claims the priority on the basis of Japanese Patent Application No. 2014-166662 filed on Aug. 19, 2014 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

What is claimed is:

1. A display unit, comprising:
   an insulating film;
   a display region that includes:
      a plurality of light-emitting sections including a plurality of light-emitting elements on the insulating film, wherein
         a light-emitting element of the plurality of light-emitting elements includes a first electrode and an organic layer, and a second electrode in this order, and
         the organic layer includes a light-emitting layer;
      a protruding portion that protrudes toward a light emitting direction between the plurality of light-emitting sections; and
      a reflective layer on the protruding portion, wherein
         the reflective layer is between the plurality of light-emitting sections,
         the reflective layer reflects light emitted from the light-emitting element, and
         the reflective layer includes an electric conductive material; and
   a peripheral region that includes a common electrode, wherein
      the reflective layer electrically connects to the common electrode in the peripheral region, and
      the peripheral region is outside the display region.

2. The display unit according to claim 1, further comprising a substrate that includes the display region and the peripheral region.

3. The display unit according to claim 2, wherein the reflective layer is set a same electric potential with the second electrode.

4. The display unit according to claim 3, wherein the reflective layer is coupled to the second electrode.

5. The display unit according to claim 4, wherein the reflective layer and the second electrode are different layers.

6. The display unit according to claim 2, wherein a top surface of the protruding portion is a flat surface.

7. The display unit according to claim 6, wherein a first dielectric layer is stacked on the reflective layer.

8. The display unit according to claim 7, wherein
   the light-emitting element further comprises a plurality of sub-light-emitting elements,
   the light-emitting layer and the second electrode of the light-emitting element are common to the plurality of sub-light-emitting elements, and
   the light-emitting layer and the second electrode cover the reflective layer.

9. The display unit according to claim 8, wherein
   the second electrode of the light-emitting element is electrically coupled to the reflective layer through a second connection hole, and
   the second connection hole is in the first dielectric layer.

10. The display unit according to claim 9, wherein a bottom of the second connection hole is larger in size than an inlet of the second connection hole.

11. The display unit according to claim 10, wherein
    the first dielectric layer includes a second dielectric layer and a third dielectric layer, and
    a first etching speed of a dry etching process corresponding to the second dielectric layer is different from a second etching speed of the dry etching process corresponding to the third dielectric layer.

12. The display unit according to claim 11, wherein
    the reflective layer further comprises a bulkhead-shaped support that surrounds a light-emitting section of the plurality of light-emitting sections, and
    the reflective layer, the second dielectric layer, and the third dielectric layer are stacked in a second arrangement order on the bulkhead-shaped support.

13. The display unit according to claim 12, wherein
    the light-emitting section further comprises a plurality of sub-light-emitting sections in a matrix pattern, and
    the second connection hole of the first dielectric layer is at a position displaced from each of the plurality of sub-light-emitting sections in one of a row direction of the matrix pattern or a column direction of the matrix pattern.

14. The display unit according to claim 13, wherein each of the light-emitting section and the reflective layer is covered with a filler.

15. The display unit according to claim 14, wherein
    a first refractive index of the filler is greater than a second refractive index of the third dielectric layer, and
    the second refractive index of the third dielectric layer is greater than a third refractive index of the second dielectric layer.

16. The display unit according to claim 15, wherein the reflective layer includes at least one of silver or aluminum.

17. An electronic apparatus, comprising:
    a display unit that comprises:
       an insulating film;
       a display region that includes:
          a plurality of light-emitting sections including a plurality of light-emitting elements on the insulating film, wherein
             a light-emitting element of the plurality of light-emitting elements includes a first electrode, an organic layer, and a second electrode in this order, and
             the organic layer includes a light-emitting layer;
          a protruding portion that protrudes toward light emitting direction between the plurality of light-emitting sections; and
          a reflective layer on the protruding portion, wherein
             the reflective layer is between the plurality of light-emitting sections,
             the reflective layer reflects light emitted from the light-emitting element, and
             the reflective layer includes a conductive material; and
       a peripheral region that includes a common electrode, wherein the reflective layer is extended towards the peripheral region such that the reflective layer electrically connects to the common electrode in the peripheral region, and the peripheral region is outside the display region.

18. The electronic apparatus according to claim 17, wherein the reflective layer is set a same electric potential with the second electrode.

19. The electronic apparatus according to claim 18, wherein the reflective layer is coupled to the second electrode.

20. The electronic apparatus according to claim 19, wherein the reflective layer and the second electrode are different layers.

\* \* \* \* \*